US008772715B2

(12) United States Patent
Tanigaki et al.

(10) Patent No.: US 8,772,715 B2
(45) Date of Patent: Jul. 8, 2014

(54) ELECTRON BEAM DEVICE INCLUDING A FIRST ELECTRON BIPRISM TO SPLIT AN ELECTRON BEAM INTO TWO BEAMS AND A SECOND ELECTRON BIPRISM IN THE IMAGE FORMING LENS SYSTEM TO SUPERPOSE THE TWO BEAMS

(71) Applicants: Riken, Wako (JP); Hitachi, Ltd., Tokyo (JP)

(72) Inventors: Toshiaki Tanigaki, Wako (JP); Shinji Aizawa, Wako (JP); Tsuyoshi Matsuda, Wako (JP); Ken Harada, Tokyo (JP); Yoshio Takahashi, Tokyo (JP)

(73) Assignees: Hitachi, Ltd., Tokyo (JP); Riken, Saitama (JP)

( * ) Notice: Subject to any disclaimer, the term of this patent is extended or adjusted under 35 U.S.C. 154(b) by 0 days.

(21) Appl. No.: 13/869,999

(22) Filed: Apr. 25, 2013

(65) Prior Publication Data
US 2013/0284925 A1    Oct. 31, 2013

(30) Foreign Application Priority Data
Apr. 26, 2012    (JP) .................................. 2012-100545

(51) Int. Cl.
| H01J 37/26 | (2006.01) |
| H01J 37/04 | (2006.01) |
| G01B 15/00 | (2006.01) |

(52) U.S. Cl.
USPC ............................. 250/311; 250/306; 250/310

(58) Field of Classification Search
USPC ......................................... 250/306, 310, 311
See application file for complete search history.

(56) References Cited

U.S. PATENT DOCUMENTS

| 6,759,656 | B2 * | 7/2004 | Tomita | 250/311 |
| 7,012,253 | B2 * | 3/2006 | Tanji | 250/311 |
| 7,538,323 | B2 * | 5/2009 | Harada et al. | 250/310 |
| 7,655,905 | B2 * | 2/2010 | Harada et al. | 250/306 |
| 7,750,298 | B2 * | 7/2010 | Harada et al. | 250/311 |
| 7,816,648 | B2 * | 10/2010 | Harada et al. | 250/311 |
| 7,872,755 | B2 * | 1/2011 | Harada et al. | 356/450 |

(Continued)

FOREIGN PATENT DOCUMENTS

| JP | 2006-164861 | 6/2006 |
| JP | 2011-249191 | 12/2011 |

OTHER PUBLICATIONS

Akira Tonomura, Application of electron holography, Reviews of Modern Physics, Jul. 1987, pp. 639-669, vol. 59, No. 3, Part 1.

*Primary Examiner* — David A Vanore
(74) *Attorney, Agent, or Firm* — Antonelli, Terry, Stout & Kraus, LLP.

(57) ABSTRACT

An electron beam device includes a first electron biprism between an acceleration tube and irradiation lens systems, and an electron biprism in the image forming lens system. The first electron biprism splits the electron beam into first and second electron beams, radiated to differently positioned first and second regions on an objective plane of an objective lens system having a specimen perpendicular to an optical axis. The first and second electron beams are superposed on the observation plane by the electron biprism of the image forming lens system. The superposed region is observed or recorded. Optical action of the irradiation lens system controls each current density of the first and second electron beams on the objective plane having the specimen, and distance on electron optics between the first electron biprism and the objective plane of the objective lens system having the specimen.

20 Claims, 22 Drawing Sheets

(56) References Cited

U.S. PATENT DOCUMENTS

| | | | |
|---|---|---|---|
| 7,923,685 B2* | 4/2011 | Harada et al. | 250/310 |
| 8,193,494 B2* | 6/2012 | Harada et al. | 250/311 |
| 2008/0302965 A1* | 12/2008 | Harada et al. | 250/311 |
| 2009/0045339 A1* | 2/2009 | Harada et al. | 250/311 |
| 2013/0163076 A1* | 6/2013 | Nagaoki et al. | 359/370 |
| 2013/0284925 A1* | 10/2013 | TANIGAKI et al. | 250/311 |

* cited by examiner

ELECTRON BEAM DEVICE INCLUDING A FIRST ELECTRON BIPRISM TO SPLIT AN ELECTRON BEAM INTO TWO BEAMS AND A SECOND ELECTRON BIPRISM IN THE IMAGE FORMING LENS SYSTEM TO SUPERPOSE THE TWO BEAMS

CLAIM OF PRIORITY

The present application claims priority from Japanese patent application JP2012-100545 filed on Apr. 26, 2012, the content of which is hereby incorporated by reference into this application.

BACKGROUND OF THE INVENTION

The present invention relates to a device using an electron beam, and more particularly, the present invention relates to electron beam interferomatic technology using an electron microscope.

An electron interferometer is used for measuring the phase change of the electron beam as an approach that quantitatively measures the magnetic field of a substance or in vacuum. FIG. 1A shows an optical setup for interferometry for a generally employed electron holography. The electron beam 2 emitted from the electron source 1 advances as shown in the drawing. Current density is adjusted by the first irradiation electron lens 3 and the second irradiation electron lens 4. The specimen 6 is placed at one side of the optical axis between the second irradiation electron lens 4 and the objective lens 5 so that the specimen 6 on the objective plane 42 of the objective lens is irradiated with the electron beam. The image formed by action of the objective lens is enlarged by a magnifying lens 9. The electron beam 7 passing through the specimen in the first region on the objective plane and the electron beam 8 passing through the second region on the objective plane are curved inward by the second electron biprism 10, and are superposed on the observation plane 11. The interference fringes are then detected through interference. The phase reconstruction is performed in reference to the obtained interference fringes so as to obtain the phase change of the electron beam through the specimen 6.

The electron biprism has the function of deflecting the electron beam passing to the left or right of the electrode filament between the parallel plates in parallel with the electron beam advancing direction inward or outward with respect to the optical axis in the electric field between the filament electrode and the parallel flat plate, which is generated by applying electrical potential to the electrode filament. Generally, the system equipped with the mechanism that rotates with respect to the optical axis, and the mechanism that moves the electron biprism in the plane perpendicular to the optical axis is commercially available.

In the aforementioned method, the electron beam 7 passing through the first region and the electron beam 8 passing through the second region are adjacent with each other at the specimen position. The width of the interference region converted in terms of the specimen plane is restricted by the coherence distance of the electron beam radiated to the specimen plane in the specimen in-plane direction (see Non Patent Literature 1, Tonomura A. (1987) Applications of electron holography, Rev. Mod. Phys. 59: pp. 639-669). Patent Literatures of Japanese Patent Application Laid-Open Publication Nos. 2006-164861 and 2011-249191 relate to the aforementioned device.

The coherence distance of the aforementioned electron interferometer will be described referring to FIG. 2. The structure shown in FIG. 2 satisfies the following formula (1) having an opening angle set to $\beta$, the wavelength of the electron beam set to $\lambda$, and the coherence distance set to $L_c$ relative to the setup shown in FIG. 2 including the electron source 101, the size 102 of the electron source, the distance 103 between the electron source 101 and the specimen plane 104, and the specimen plane 104.

[Formula 1]

$$L_c = \lambda/2\beta \tag{1}$$

Assuming that the coherence distance is set to $L_c$, the maximum possible width $W_{max}$ of the interference region will satisfy the following formula.

[Formula 2]

$$W_{max} < L_c \tag{2}$$

As for the actual electron beam device, the image of the electron source is equivalent to the image reduced or enlarged by action of the irradiation lens system, objective lens system, or image forming lens system. The objective plane is also equivalent to the image plane of the specimen 6, which is enlarged or reduced by the lens of the irradiation lens system, the objective lens system or the image forming lens system at a position different from the position of the specimen on the electron beam optical axis.

Restriction of the coherence distance of the irradiation electron beam on the specimen plane may deteriorate contrast of the interference fringes as the width of the interference region is increased for observing inside of the thin film specimen. Therefore, it is not possible to make the interference width wider than the coherence distance. For that reason, the generally employed electron holography allows observation of the high contrast interference fringes only in the narrow interference region.

Charging caused by irradiating the specimen with converged electron beam influences the electron beam 8 passing through the second region, and the interference fringes are distorted. There has been a problem of difficulty in obtaining the image with reconstructed phase with high accuracy. Besides, the specimen with large leakage magnetic field also contributes to the problem. The leak magnetic field influences the electron beam 8 passing through the second region, and the interference fringes are distorted, thus interfering with the phase analysis with high accuracy. In order to solve the aforementioned problems, it is necessary to increase the in-plane distance between the electron beam 7 transmitting through the specimen in the first region and the electron beam 8 passing through the second region on the specimen plane.

Japanese Patent Application Laid-Open Publication No. 2006-164861 proposes the scan interference electron microscope as the method of irradiating the specimen plane at different regions with electron beams split by the electron biprism provided in the irradiation system without using the objective lens for forming the specimen image. This method includes the steps of irradiating the vacuum region on the specimen plane, and the specimen with the convergence electron probe, allowing the detector at lower side to detect interference fringes of the electron beam transmitting through the vacuum and the one transmitting through the specimen, and scanning the probe or the specimen while obtaining the phase information so as to obtain the electromagnetic field information in the plane of the specimen. This method allows easy acquisition of data once the condition is determined, easy change in magnification, and high ratio of signal of the phase information to noise. Meanwhile, in the case where the specimen is irradiated with the convergence electron beam, and the specimen has a certain thickness for the purpose of obtaining all the electromagnetic information data about the region at the observation points during scanning, which is irradiated with the cone-like electron probe, resolution at the position as the upper surface or the lower surface of the specimen upon passage of the cone-like electron probe through the specimen may be increased corresponding to the larger diameter of the electron beam. For example, likewise tomography, the method is not suitable for application to the approach requiring the image with two-dimensional projection phase information that is not blurred in the lateral direction.

The inventor has proposed the method of irradiating the specimen with the electron beam 7 transmitting through the specimen 6 in the first region on the specimen plane and the electron beam 8 passing through the second region, while keeping a distance therebetween as shown in FIG. 1B in Japanese Patent Application Laid-Open Publication No. 2011-249191. This method includes the steps of splitting the electron wave by the first electron biprism 12 provided in the irradiation system, deflecting the advancing direction, irradiating the specimen with the electron beam 7 transmitting through the first region (specimen) on the specimen plane and the electron beam 8 passing through the second region while keeping the distance therebetween, deflecting the electron beam by the second electron biprism 10 downstream of the specimen in the electron beam advancing direction, and interfering on the observation plane 11 to detect the interference fringes. The electron beam coherent in the in-plane direction of the electron beam 7 transmitting through the first region (specimen) on the specimen plane and the electron beam 8 passing through the second region is split and radiated. Although the distance between the electron beam 7 transmitting through the first region (specimen) on the specimen plane and the electron beam 8 passing through the second region is made longer than the coherence distance of the irradiating electron beam in the in-plane direction without splitting the electron beam by the first biprism 12, it is possible to obtain the high contrast interference fringes in principle.

However, the actual electron beam device needs to optimize the setup of the irradiation system and the condition for using the lens current of the irradiation system for interference of the electron beam on the specimen plane so as to obtain the effect of the aforementioned split irradiation. Specifically, there has been a problem that the region of the specimen plane on the electron optics where the electron beam interference occurs is hidden by the electrode filament of the first electron biprism, and the interference fringes cannot be obtained.

BRIEF SUMMARY OF THE INVENTION

The present invention provides an electron beam device that obtains the interference fringes by irradiating the specimen with electron beams split by the biprism of the irradiation system. The device is capable of adjusting the irradiation distance by splitting the electron beam on the specimen plane using the biprism while eliminating the influence of the shadow of the biprism, that is, the biprism hides the coherent electron beam to prevent the electron beam from reaching the observation plane 11.

The present invention provides an electron beam device that includes an electron source, an acceleration tube that brings an electron emitted from the electron source into an electron beam at a predetermined velocity, an irradiation lens system that irradiates a specimen with the electron beam, a specimen holder that holds the specimen, an objective lens system that includes at least one electron lens for forming an image of the specimen, an image forming lens system that forms the image of the specimen, which has been formed by the objective lens system, an observation plane for observation of the specimen image formed by the image forming lens system, an observation recording system for observing or recording the specimen image formed on the observation plane, a first electron biprism provided between the acceleration tube and the irradiation lens system for splitting the electron beam into a first electron beam and a second electron beam, and at least one electron biprism provided in the image forming lens system for superposing the first electron beam and the second electron beam on the observation plane. An optical action of the irradiation lens system controls each current density of the first electron beam and the second electron beam on an objective plane of the objective lens system where the specimen exists, and a distance on electron optics between the first electron biprism and the objective plane of the objective lens system where the specimen exists. A first region and a second region differently positioned on the objective plane of the objective lens system are irradiated with the first electron beam and the second electron beam, respectively. A superposed region of the first electron beam and the second electron beam on the observation plane is observed or recorded by the observation recording system.

The present invention provides an electron beam device provided with an electron biprism including a pair of parallel plate ground electrodes having an optical axis interposed therebetween, and an electrode filament provided in a center part of the parallel flat electrodes while perpendicularly intersecting the optical axis. The device includes an electron source, an acceleration tube that brings an electron emitted from the electron source into an electron beam at a predetermined velocity, an irradiation lens system that irradiates a specimen with the electron beam, a specimen holder that holds the specimen, an objective lens system that includes at least one electron lens for forming an image of the specimen, an image forming lens system that forms the image of the specimen, which has been formed by the objective lens system, an observation plane for observation of the specimen image formed by the image forming lens system, an observation recording system for observing or recording the specimen image formed on the observation plane, a first electron biprism provided in the irradiation lens system for splitting the electron beam into a first electron beam and a second electron beam, and at least one electron biprism provided in the image forming lens system for superposing the first electron beam and the second electron beam on the observation plane. An optical action of the irradiation lens system controls each current density of the first electron beam and the second electron beam on the objective plane of the objective lens system where the specimen exists, and a distance on electron optics between the first electron biprism and the objective plane of the objective lens system where the specimen exists. The optical action of the irradiation lens system satisfies a formula (3) or (4).

[Formula 3]

$$\beta 1 < \lambda / 2d1 \tag{3}$$

[Formula 4]

$$L_{c1} > d1 \tag{4}$$

where $\lambda$ denotes a wavelength of the electron beam, $L_{c1}$ denotes a coherence distance of the electron beam on a plane of the electrode filament of the first electron biprism on the electron optics, β1 denotes an opening angle of the electron beam emitted from the electron source on the electron optics with respect to the first electrode filament plane on the electron optics, and d1 denotes a diameter of the electrode filament of the first electron biprism on the electron optics.

The present invention provides an electron beam device that includes an electron source, an acceleration tube that brings an electron emitted from the electron source into an electron beam at a predetermined velocity, an irradiation lens system that includes at least one electron lens for irradiating a specimen with the electron beam, a specimen holder that holds the specimen, an objective lens system that includes at least one electron lens for forming an image of the specimen, an image forming lens system that forms the image of the specimen, which has been formed by the objective lens system, an observation plane for observation of the specimen image formed by the image forming lens system, an observation recording system for observing or recording the specimen image formed on the observation plane, a first electron biprism provided between the irradiation lens system and the specimen for splitting the electron beam into a first electron beam that transmits through the specimen and a second electron beam that does not transmit through the specimen, and at least one electron biprism provided in the image forming lens system for superposing the first electron beam and the second electron beam on the observation plane. An optical action of the irradiation lens system controls each current density of the first electron beam and the second electron beam on the objective plane of the objective lens system where the specimen exists, and a distance on electron optics between the electron source when the image is formed by the irradiation lens system and the objective plane of the objective lens system where the specimen exists. A distance between the first electron biprism and the objective plane of the objective lens system where the specimen exists on electron optics is controlled so that the first electron beam and the second electron beam are radiated to a first region and a second region differently positioned on the objective plane of the objective lens system where the specimen exists. The superposed region of the first electron beam and the second electron beam on the observation plane is observed or recorded by the observation recording system.

The present invention is capable of controlling the in-plane distance between the electron beam transmitting through the specimen in the first region and the electron beam passing through the second region on the specimen plane, and each current density. The second electron biprism of the image forming system superposes the first electron beam and the second electron beam on the observation plane so as to ensure the hologram with high contrast. The high contrast hologram of the inner region of the thin film specimen seen from its edge may be obtained with high magnification at high current density. This makes it possible to perform high accuracy phase analysis by reducing noise of the reconstructed phase image upon phase reconstruction of the hologram.

BRIEF DESCRIPTION OF THE DRAWINGS

FIG. 10 is a schematic view showing an electron beam device according to a fourth embodiment, which includes a setup of a first irradiation electron lens, a first electron biprism, a second irradiation electron lens, a third irradiation electron lens, and a specimen in this order;

DETAILED DESCRIPTION OF THE INVENTION

Figure 1A:
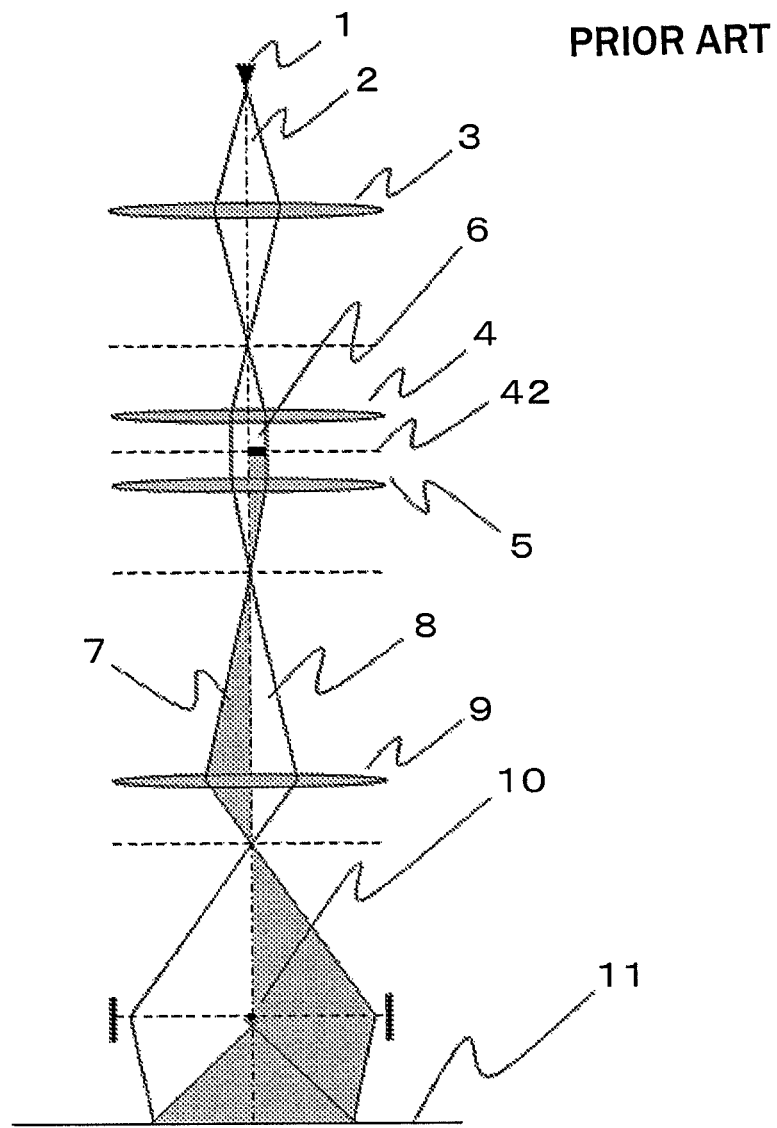
FIG. 1A is a schematic view showing an example of an electron beam device according to a generally employed method.
Figure 1B:
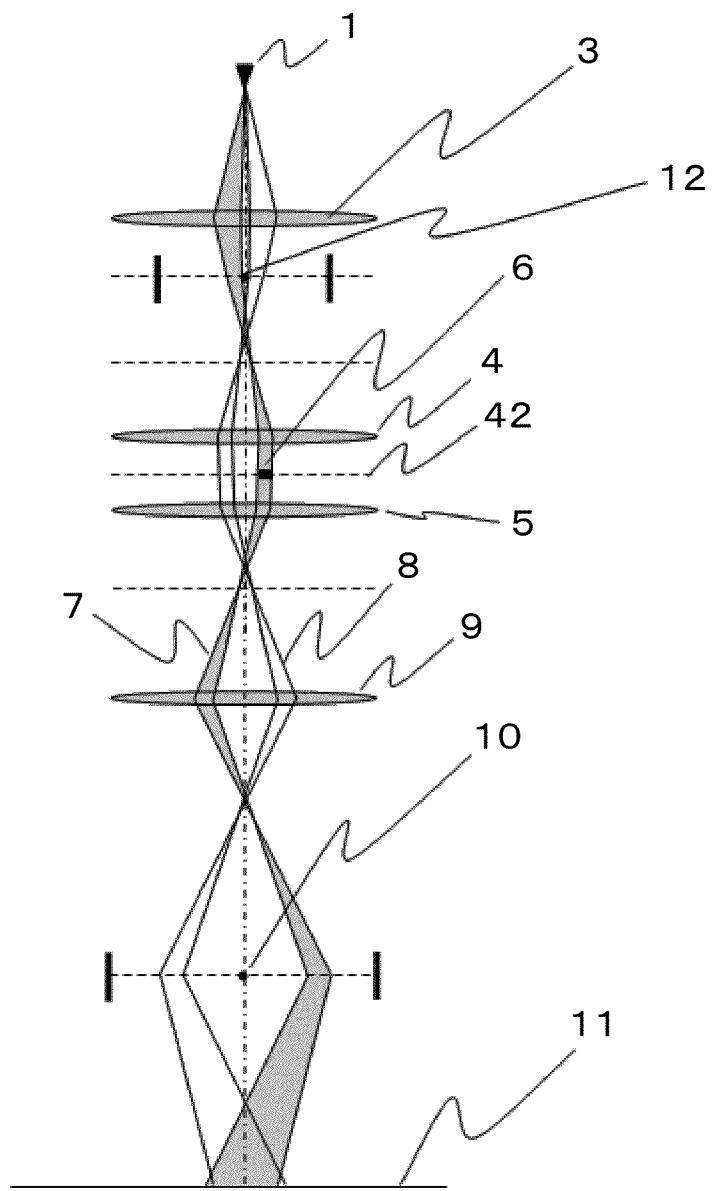
FIG. 1B is a schematic view showing another example of an electron beam device according to a generally employed method.
Figure 2:
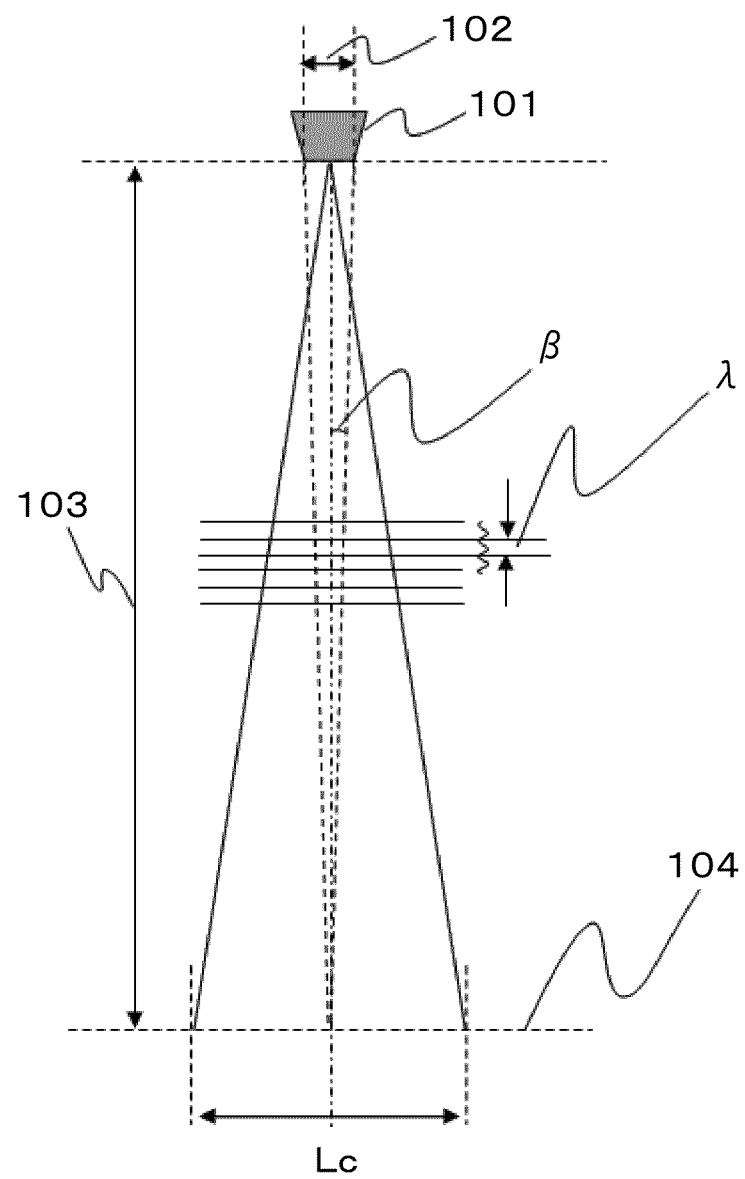
FIG. 2 is a schematic view showing a coherence distance of an electron beam in the structure of principle according to the present invention.
Figure 3:
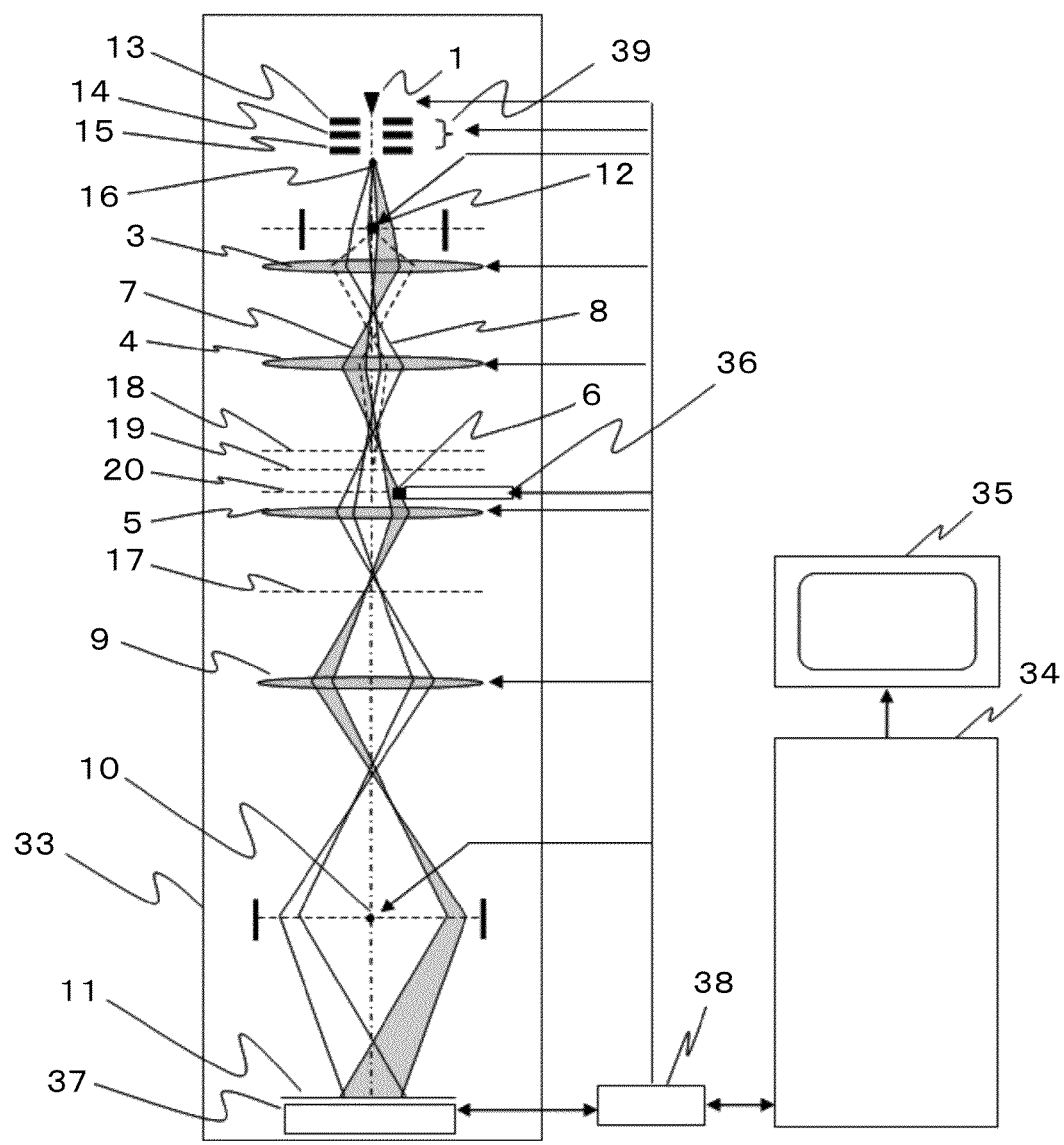
FIG. 3 is a schematic view showing an electron beam device according to a first embodiment, which includes a setup of a first electron biprism, a first irradiation electron lens, a second irradiation electron lens, and a specimen in this order.

Prior to description of embodiments of the electron beam device according to the present invention referring to the drawings, explanation will be made with respect to the principle structure of the electron beam device according to the present invention, that is, the interference microscope using the transmission type electron microscope in reference to the schematic view of FIG. 3. As described later, FIG. 3 shows a setup of a first embodiment of the interference microscope using the transmission type electron microscope. However, the principle structure to be described below may be applied to the electron beam device according to other embodiments which will be described referring to the other drawings.

Referring to FIG. 3, an electron source 1 is provided at the most upstream side in the electron beam flow direction so that voltage is applied to a first extraction electrode 13, a second extraction electrode 14, and an acceleration electrode 15. Electron beam emitted from the electron source 1 is accelerated and converged by a first electron source 16. The first extraction electrode 13, the second extraction electrode 14 and the acceleration electrode 15 will be collectively defined as an acceleration tube 39 hereinafter. As the applied voltage is controlled, the wavelength of the electron beam is changed as well as its orbit. Accordingly, the first electron source 16 on electron optics is illustrated in the drawing.

A first electron biprism 12 provided downstream in the direction of the electron beam flow from the first electron source 16, that is, between the acceleration tube 39 and a first irradiation electron lens 3 deflects the electron beam inward with respect to the optical axis, which is directed toward the first irradiation electron lens 3. Actions of the first irradiation electron lens 3 and a second irradiation electron lens 4 control each current density of an electron beam 7 that transmits through a first region where the specimen 6 is placed, and the electron beam 8 that passes through a second region where the specimen is not placed on the specimen plane. The two regions on the specimen plane are irradiated with the two electron beams 7 and 8, respectively.

An image of the specimen 6 is formed on an objective lens 5 placed downstream of the specimen 6. The image forming action is followed by a magnifying lens 9 downstream of the objective lens 5. Finally, the image is formed on an observation plane 11 of the interference microscope using the transmission type electron microscope. The image of the first electron source is formed on a second electron source plane 17.

The electron beam 7 that has passed through the specimen plane, and transmits through the specimen 6 in the first region, and the electron beam 8 that passes through the second region are deflected with respect to the optical axis by a second electron biprism 10 provided in a shadow region formed by the first electron biprism 12. Those beams are superposed on the observation plane 11 of the electron beam device to provide the hologram through interference. The obtained hologram is detected by an electron beam detector 37 such as the electron microscope film and a CCD camera.

Referring to the electron beam device shown in FIG. 3, a control system 38 connected to a control personal computer (PC) 34 controls voltage applied to the electron source 1 and the acceleration tube 39, excitation states of the specimen fine adjustment 36, and the electron lens, and the voltage applied to the electron biprism. The actual electron beam device further includes a deflection system that changes advancing direction of the electron beam and a diaphragm mechanism that limits the region through which the electron beam transmits in addition to those shown in the schematic view. Those elements are also controlled by the control system 38 connected to the control PC 34. The aforementioned devices are not directly related to the electron beam device according to the present invention. Therefore, they are not illustrated in the drawing.

The control PC 34 has a general structure of the computer including a CPU (Central Processing Unit) as the processing unit, a memory as the storage unit, and an I/O interface, which are connected with one another. The PC 34 and the control system 38 for controlling the devices may be referred to as a control unit collectively. The control unit does not have to be formed of a single unit of the computer. For example, the computer for controlling the electron biprism may be provided independently from the computer that controls other elements for constituting the electron beam device. In such a case, a plurality of computers may be referred to as the control unit collectively. As the schematic view shows, the electron optical element is assembled in a main body 33 of the microscope as the vacuum vessel, and continuously evacuated by the vacuum pump. The vacuum system is not directly related to the electron beam device according to the present invention. Accordingly, those elements are not shown, and explanation thereof will be omitted.

The above-structured electron beam device may be combined with a holography electron microscope equipped with a plurality of biprisms between the specimen and the electron beam detector so that the spacing of the interference fringes and the width of the interference region may be adjusted arbitrarily. The holography electron microscope equipped with a plurality of biprisms is disclosed in Japanese Patent Application Laid-Open Publication Nos. 2006-216345 and 2006-313069 filed by the inventor, and detailed explanations and drawings thereof, thus will be omitted.

Figure 4:
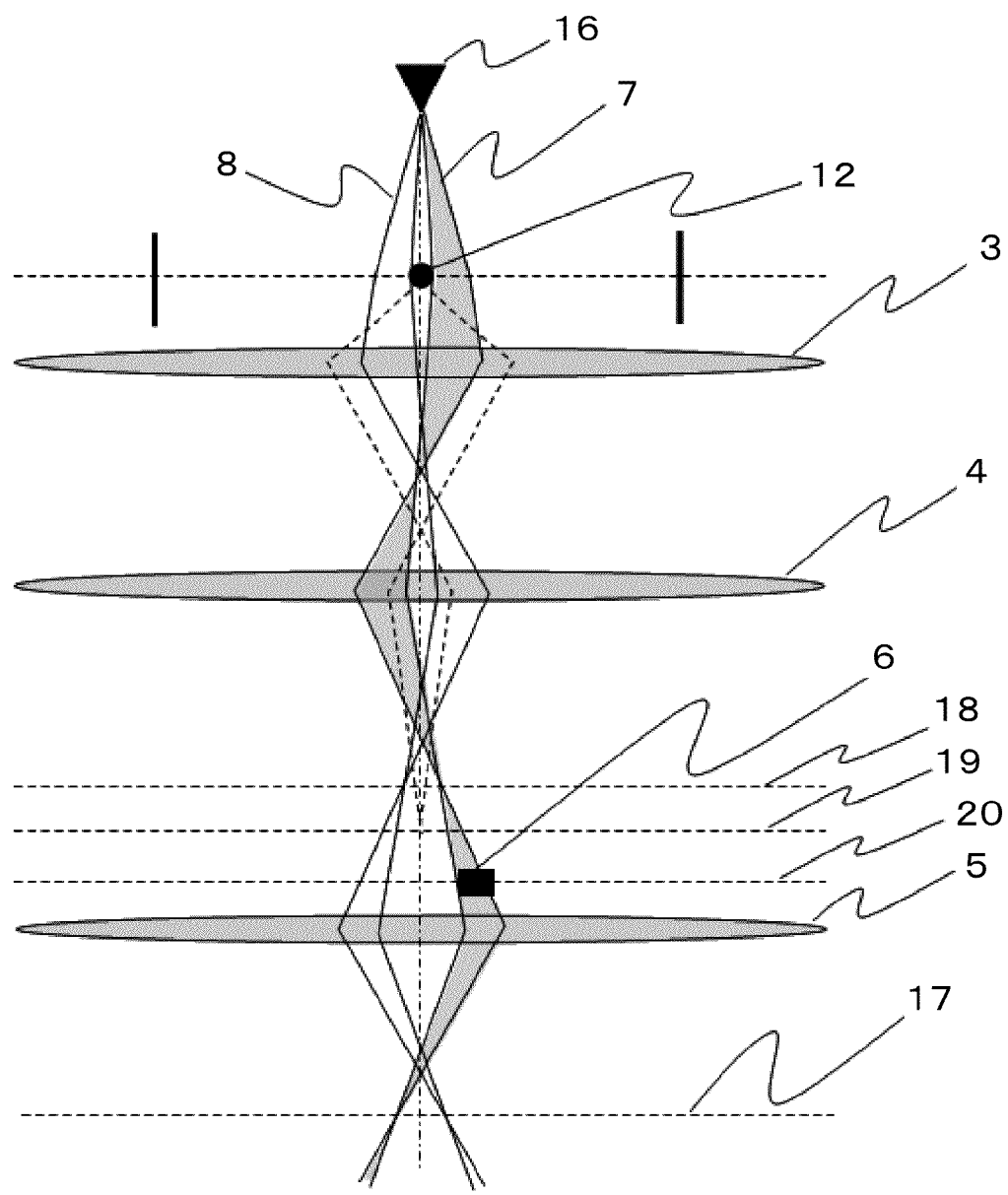
FIG. 4 is a schematic view showing an upper optical system of the first embodiment.

FIG. 4 is a schematic view showing the optical system of the setup of the electron beam device shown in FIG. 3, from the first electron source 16 to the second electron source plane 17 just below the objective lens 5. The optical system in the illustrated range will be collectively defined as the upper optical system. Referring to FIG. 4, in the electron source plane 18 on the electron optics, an image of the first electron source 16 is formed by lens actions of the third irradiation electron lens 3 and the fourth irradiation electron lens 4. In a first electrode filament plane 19 on the electron optics, an image of the electrode filament of the first electron biprism 12 is formed by the lens actions of the third irradiation electron lens 3 and the fourth irradiation electron lens 4. A specimen plane 20 on the electron optics is equivalent to the plane on which the specimen actually exists.

This specification focuses on three planes on the electron beam optical axis, that is, the plane where the first electron source 16 exists or the image of the first electron source 16 is formed as a virtual image or real image by the action of the electron lens of the irradiation system, the plane where the first electron biprism 12 exists or the image of the first electron biprism 12 is formed as the virtual image or the real image by the action of the electron lens of the irradiation system, and a plane where the specimen exists or the image is formed as the virtual image or the real image by the action of the electron lens of the irradiation system. Those planes are positionally related without having the electron lens interposed thereamong, and will be referred to as an electron source plane 18 on electron optics, a first electrode filament plane 19 on electron optics, and a specimen plane 20 on electron optics, respectively.

Figure 5:
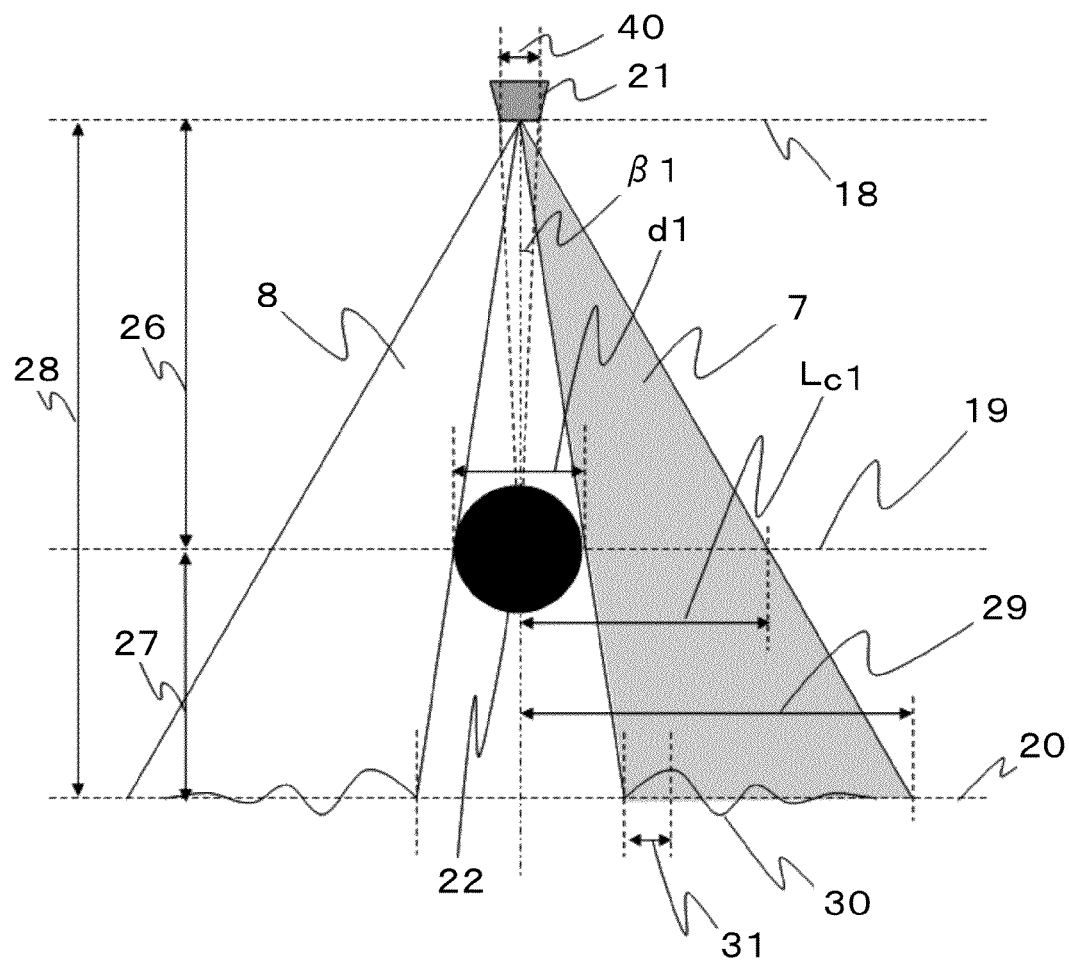
FIG. 5 is a schematic view showing a positional relationship among the light source on the electron optics, the electron biprism, and the specimen in view of principle of the present invention.

FIG. 5 represents the relationship of the electron source plane 18 on the electron optics, the first electrode filament plane 19 on the optical optics, and the specimen plane 20.

FIG. 5 shows an electron source 21 on the electron source plane 18 on the electron optics, an electrode filament 22 of the first electron biprism on the electron optics, an opening angle β1 of the electron beam emitted from the electron source 21 on the electron optics with respect to the first electrode filament plane on the electron optics, a coherence distance $L_{c1}$ of the electron wave in the first electrode filament plane on the electron optics, a diameter d1 of the first electrode filament 22 on the electron optics, a distance 26 from the electron source 21 on the electron optics to the first electrode filament plane on the electron optics, a distance 27 from the first electrode filament 22 on the electron optics to the specimen plane 20 on the electron optics, a distance 28 from the electron source 21 on the electron optics to the specimen plane 20 on the electron optics, a coherence distance 29 of the electron wave on the specimen plane 20 on the electron optics, a Fresnel fringe 30 of the first electrode filament generated on the specimen plane on the electron optics, and a distance 31 from the edge of the first electrode filament on the specimen plane on the electron optics to the first line of the Fresnel fringe.

For the electron beam device shown in FIGS. 3 to 5, actions of the first irradiation electron lens 3 and the second irradiation electron lens 4 control each current density of the first electron beam 7 that transmits through the specimen 6 in the first region and the second electron beam 8 that passes through the second region on the specimen plane. The actions further control the distance 28 between the plane where the electron source exists on the electron optics and the specimen plane on the electron optics, the distance 27 between the first electrode filament on the electron optics and the specimen plane on the electron optics, the distance 26 between the electron source 21 on the electron optics and the first electrode filament plane on the electron optics, and the opening angle β1 of the electron beam emitted from the electron source 21 on the electron optics with respect to the first electrode filament plane on the electron optics. By setting the wavelength of the electron beam to λ, the opening angle of the electron beam emitted from the electron source 21 on the electron optics to β1, and the diameter of the first electrode filament on the electron optics to d1, they may be controlled to establish the relationship that satisfies the formula (3) as described above.

Alternatively, actions of the first irradiation electron lens 3 and the second irradiation electron lens 4 control each current density of the electron beam 7 that transmits through the specimen 6 in the first region and the electron beam 8 that passes through the second region on the specimen plane. By setting the coherence distance of the electron wave on the first electrode filament plane on the electron optics to $L_{c1}$, and the diameter of the first electrode filament on the electron optics to d1, they may be controlled to establish the relationship that satisfies the formula (4) as described above.

The electron beam device structured to establish the relationship that satisfies the formula (3) or (4) may solve the problem that the shadow of the first electron biprism hides the coherence region of the electron beam on the specimen plane.

The distance from the first electrode filament to the specimen plane on the electron optics is set to L2 to control so that the following formula (5) is satisfied:

[Formula 5]

$$0 \neq L2 \qquad (5)$$

The relationship that satisfies this formula (5) may prevent the problem of losing function of adjusting the distance for irradiation on the specimen plane with the split electron beam when the position of the first electron biprism on the electron optics becomes the same as that of the specimen on the electron optics.

The electron beam device shown in FIG. 3 has the structure that actions of the first irradiation electron lens 3 and the second irradiation electron lens control each current density of the electron beam 7 that transmits through the specimen in the first region and the electron beam 8 that passes through the second region on the specimen plane. By setting the distance 27 between the first electrode filament 22 on the electron optics and the specimen plane 20 on the electron optics, they may be controlled to establish the relationship that satisfies the above formula (5).

The aforementioned principle structure is applicable to the device structure shown in the drawings other than FIG. 3. Embodiments according to the present invention will be described referring to the drawings.

First Embodiment

A first Embodiment relates to the interference microscope using the transmission type electron microscope.

FIG. 3 schematically shows the optical system of the electron beam device according to the first embodiment. The electron beam device shown in FIG. 3 is intended to use the general purpose transmission type electron microscope for the interference microscope. However, the first embodiment is not limited to those described referring to the drawing. FIG. 4 shows the upper optical system of the electron beam device according to the first embodiment as shown in FIG. 3. FIG. 5 shows the relationship of the electron source on the electron optics, the first electrode filament plane on the electron optics, and the specimen plane. They have been already described, and explanations thereof will be omitted.

As for the electron beam device according to the first embodiment shown in FIG. 3, the electron source 1 is located at the most upstream part in the electron beam flow direction. Voltage is applied to the first extraction electrode 13, the second extraction electrode 14, and the acceleration electrode 15 which constitute the acceleration tube 39. The electron beam emitted from the electron source 1 is accelerated to form the first electron source 16.

Referring to the structure of the embodiment, the first electron biprism is located downstream of the first electron source 16, and upstream of the electron lens of the irradiation system. In other words, the electron beam is deflected with respect to the optical axis by the first electron biprism 12 between the acceleration tube 39 and the first irradiation electron lens 3 in the direction downstream of the electron beam from the first electron source 16, and directed toward the first irradiation electron lens 3.

Actions of the first irradiation electron lens 3 and the second irradiation electron lens 4 control each current density and position of the electron beam 7 that transmits through the specimen 6 in the first region and the electron beam 8 that passes through the second region on the specimen plane so that the two regions on the specimen plane are irradiated with two electron beams, respectively.

Referring to the electron beam device according to the embodiment, the first electron biprism 12 is provided upstream of the electron lens of the irradiation system. As the relationship between the coherence distance at the electron biprism and the filament diameter does not change, the user is allowed to focus only on the position of irradiation and the degree of irradiation current density. The biprism may be reduced and reflected on the specimen plane by the electron lens of the irradiation system, which is provided downstream of the first electron biprism 12. This makes it possible to reduce the shadow of the biprism on the specimen plane.

It is possible to apply arbitrary potential to the first electron biprism 12 by the control system 38 connected to the control PC 34. This makes it possible to arbitrarily control the distance between the electron beam 7 that transmits through the specimen in the first region and the electron beam 8 that passes through the second region at the position of the specimen 6 on its plane. The distance between the electron beam 7 that transmits through the specimen 6 in the first region and the electron beam 8 that passes through the second region at the position of the specimen 6 on its plane may be controlled by action of the lens of the irradiation system. The structure of the device with a plurality of irradiation electron lenses which have been added makes it possible to increase the limited range of the distance between the electron beam 7 that transmits through the specimen in the first region and the electron beam 8 that passes through the second region at the position of the specimen 6 on its plane.

When changing the action of the lens of the irradiation system for changing the current density on the specimen plane, the electron beam is converged while spirally rotating in the microscope. Accordingly, the positional relationship between the electron beam 7 that transmits through the specimen in the first region at the specimen position and the electron beam 8 that passes through the second region rotates in the plane, and the distance therebetween changes. The biprism may be directed so as to be rotated in the plane perpendicular to the optical axis in association with current of the lens of the irradiation system for the purpose of preventing the in-plane rotation of the positional relationship between the electron beam 7 that transmits through the specimen in the first region on the specimen plane and the electron beam 8 that passes through the second region.

The aforementioned association establishes the relationship unique to the device. Data file for the association operation are stored in the memory and the like of the control PC 34 to change the lens current of the irradiation system, and simultaneously, the stored data file may be read so as to allow the control system 38 to rotate the first electron biprism in the direction registered in the data file by the registered amount. The control allows the user to change the current density on the specimen plane without stress and to retain the positional relationship between the electron beam 7 that transmits through the specimen in the first region and the electron beam 8 that passes through the second region in the rotating direction in the specimen plane with ease.

An image of the electron beam that has transmitted through the specimen 6 is formed on the objective lens 5 downstream of the specimen 6 in the advancing direction of the electron beam. The process after the image forming action has been already described, and explanation thereof, thus will be omitted.

It has been described that the specific interference condition may be provided in the stabilized manner by associating the lens current of the irradiation system with direction of the biprism. Likewise, it is effective to associate the lens current of the image forming system with the respective directions of the biprisms of the image forming system for rotation. Those association conditions are stored in the control PC 34, and read when needed for appropriate operation. As for the device structure with a plurality of magnifying lenses that have been added, it is possible to widen the control range that covers the magnification, the positional relationship between the electrode filament of the electron biprism of the irradiation system and the image plane, and the positional relationship between the electrode filament of the electron biprism of the image forming system and the position at which the electron beam is converged. This makes it possible to arbitrarily control the observation magnification, the spacing of interference fringes, and the width of the interference region. The device structure of the aforementioned image forming system and control thereof have been already disclosed in WO 2010/026867 filed by the inventor, and detailed explanation thereof, thus, will be omitted.

The interference fringes detected by the electron detector 37 are immediately reconstructed by the control PC 34 via the control system 38, and the reconstructed image is displayed on a monitor 35. Explanation of the reconstruction process as the established method (see Non Patent Literature 1) will be omitted herein. Referring to the electron beam device according to the embodiment, that is, the interference microscope using the transmission type electron microscope, the first electron biprism is provided downstream of the first electron source and upstream of the electron lens of the irradiation system. The relationship between the coherence distance and the filament diameter at the position of the electron biprism does not change. Then the user is allowed to focus only on the position of irradiation and the degree of irradiation current density. The electron lens of the irradiation system provided downstream of the first electron biprism allows the biprism to be reduced and projected on the specimen plane while reducing the biprism shadow. This makes it possible to reduce the shadow of the biprism on the specimen plane.

Second Embodiment

Figure 6:
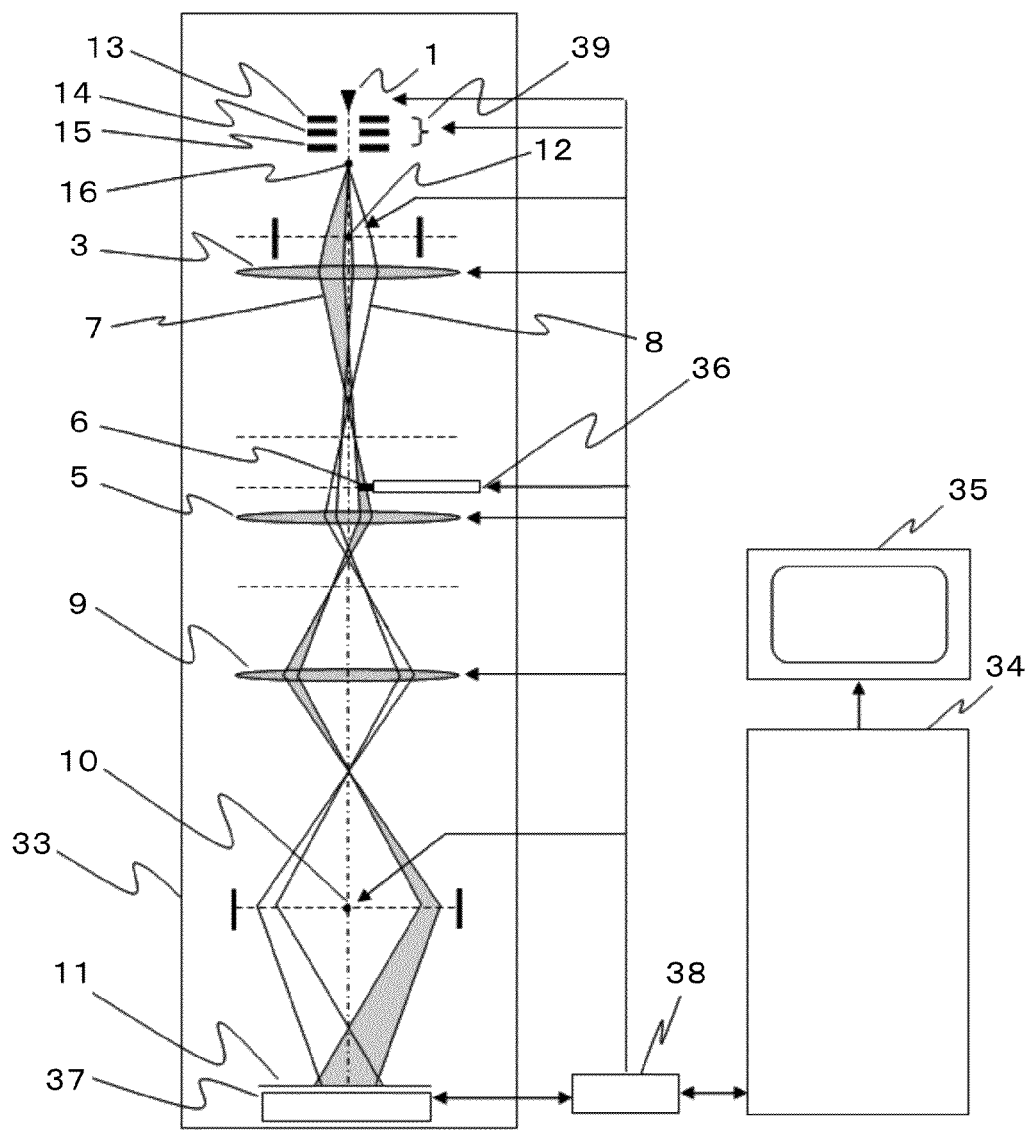
FIG. 6 is a schematic view showing an electron beam device according to a second embodiment, which includes a setup of a first electron biprism, a first irradiation electron lens, and a specimen in this order.
Figure 7:
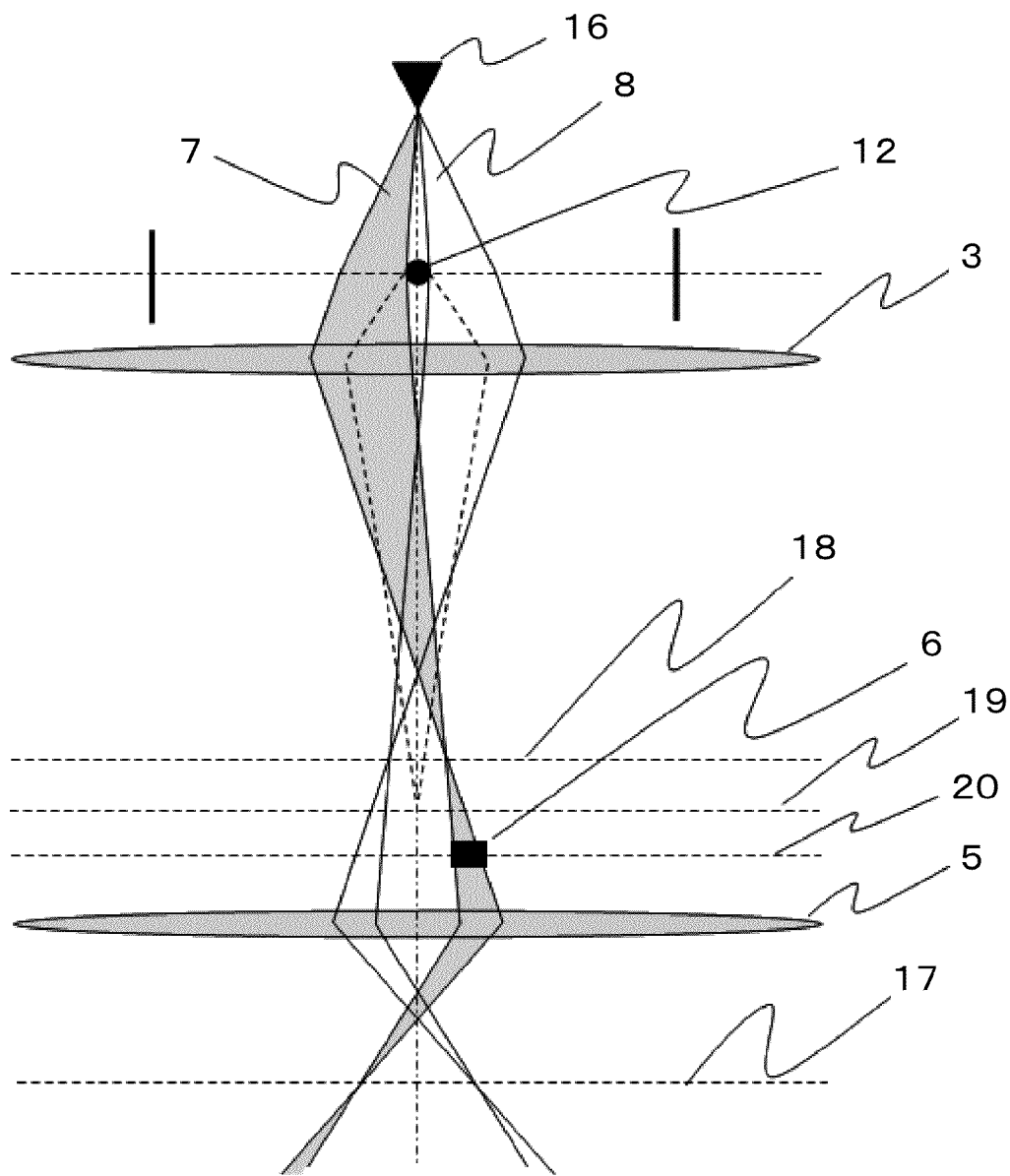
FIG. 7 is a schematic view showing an upper optical system of the second embodiment.

FIG. 6 is a schematic view showing an electron beam device according to a second embodiment. FIG. 7 is a schematic view showing an upper optical system of the electron beam device shown in FIG. 6. The overall structure of the device is similar to that of the first embodiment. Therefore, explanation of the same parts as those of the first embodiment will be omitted, and the upper optical system with different structure will be described.

Referring to the electron beam device according to the embodiment, that is, the interference microscope using the transmission type electron microscope, the first electron biprism is provided downstream of the first electron source and upstream of the electron lens of the irradiation system. However, as for the electron beam device as FIG. 7 clearly shows, the electron lens of the irradiation system is formed only of the first irradiation electron lens 3, while omitting the second irradiation electron lens 4. It is therefore possible to configure the interference microscope using the desired transmission type electron microscope with the simplest structure.

For the electron beam device according to the second embodiment, the first electron biprism 12 between the acceleration tube 39 and the first irradiation electron lens 3 in the direction downstream of the electron beam flow from the first electron source 16 deflects the electron beam with respect to the optical axis, which is directed to the first irradiation electron lens 3. Action of the first irradiation electron lens 3 controls each current density and position of the electron beam 7 that transmits through the specimen in the first region and the electron beam 8 that passes through the second region on the specimen plane. Then the two regions on the specimen plane are irradiated with the two electron beams, respectively.

Likewise the first embodiment, the first electron biprism is provided downstream of the first electron source and upstream of the electron lens of the irradiation system. As the relationship between the coherence distance at the position of the electron biprism and the filament diameter does not change, the user is allowed to focus only on the position of irradiation and the degree of irradiation current density. The electron lens of the irradiation system provided downstream of the first electron biprism makes it possible to reduce the shadow of the biprism on the specimen plane through projection of the reduced biprism thereon. The electron beam device may further be simplified.

Third Embodiment

Figure 8:
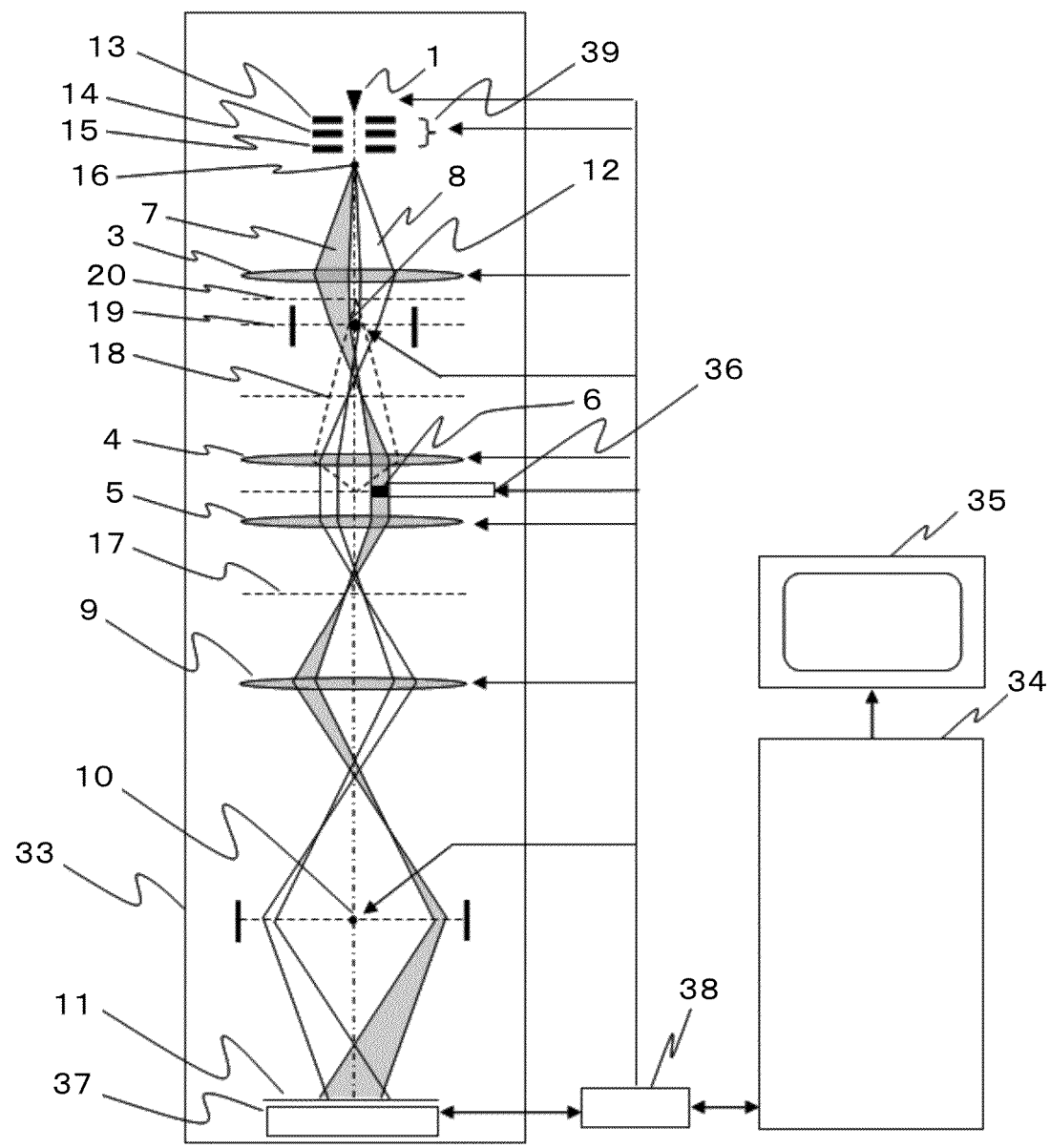
FIG. 8 is a schematic view showing an electron beam device according to a third embodiment, which includes a setup of a first irradiation electron lens, a first electron biprism, a second irradiation electron lens, and a specimen in this order.
Figure 9:
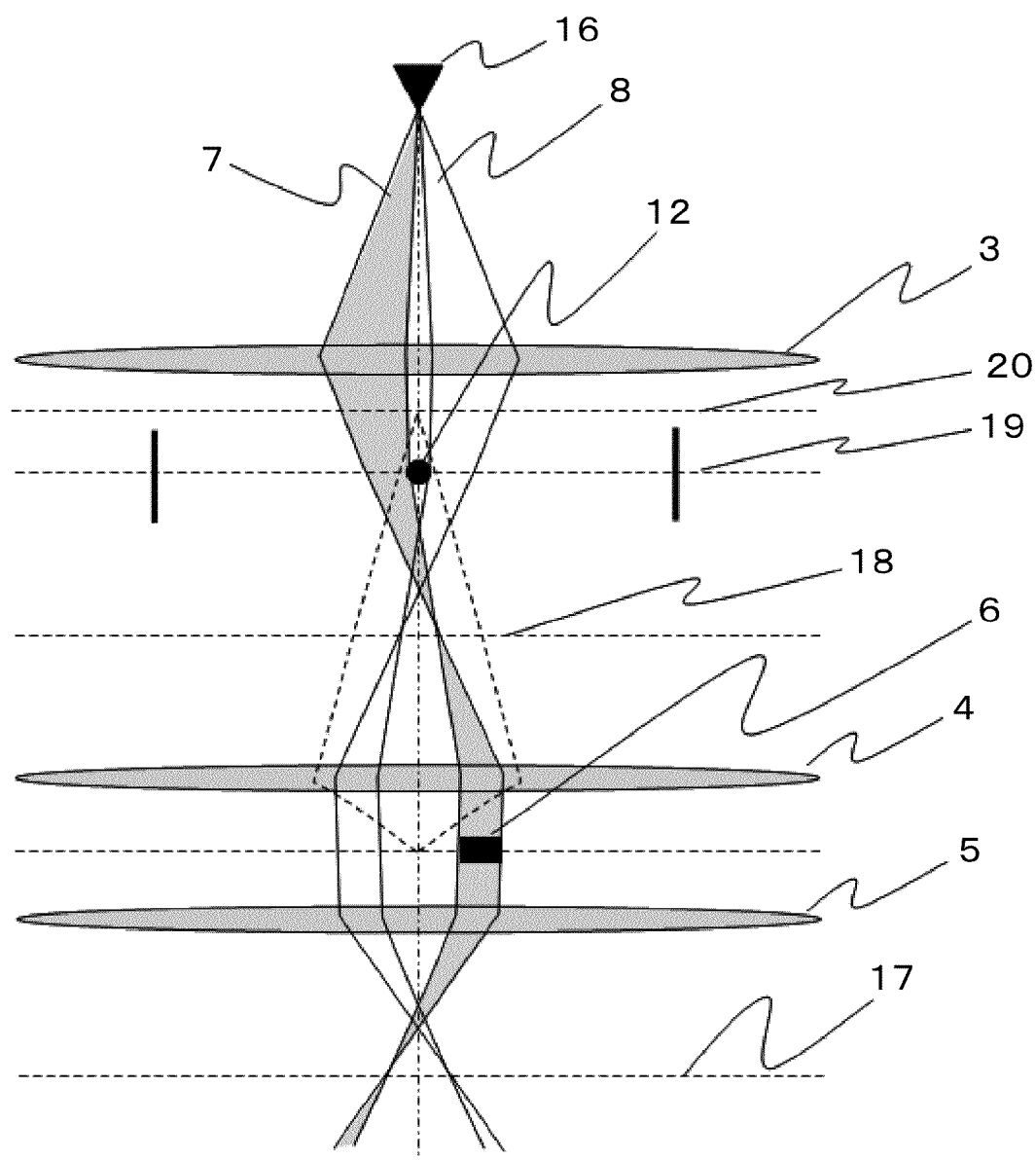
FIG. 9 is a schematic view showing an upper optical system of the third embodiment.
Figure 1O:
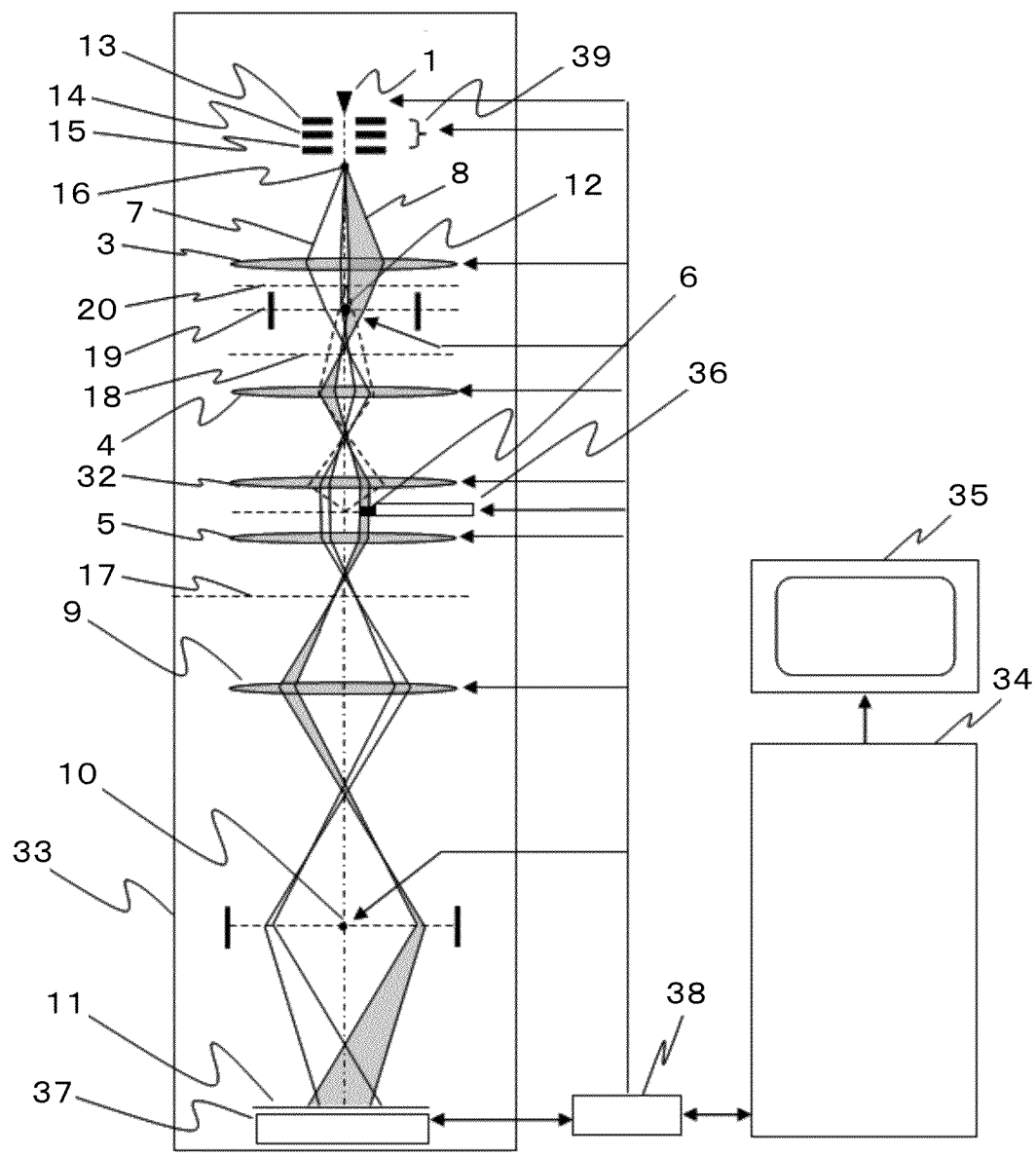

FIG. 8 is a schematic view showing an electron beam device according to a third embodiment. FIG. 9 shows an upper optical system of the electron beam device. As the overall structure of the electron beam device is similar to that of the first embodiment, explanation of the same parts as those of the first embodiment will be omitted. The upper optical system with different device structure will only be described. The upper optical system of the electron beam device according to this embodiment has the feature that the first electron biprism is provided inside the electron lens of the irradiation system, that is, between the first and the second irradiation electron lenses which constitute the electron lens of the irradiation system. Action of the second irradiation electron lens then serves to irradiate the specimen with parallel electron beams.

Referring to the electron beam device according to the third embodiment as FIG. 9 clearly shows, the first irradiation electron lens 3, the first electron biprism 12, the second irradiation electron lens 4 and the specimen 6 are provided in this order in the direction downstream of the electron beam flow from the first electron source 16. The first electron biprism 12 between the first irradiation electron lens 3 and the second irradiation electron lens 4 deflects the electron beam with respect to the optical axis, which is directed toward the second irradiation electron lens 4.

With the structure according to the embodiment, actions of the first irradiation electron lens 3 and the second irradiation electron lens 4 control each current density and position of the electron beam 7 that transmits through the specimen 6 in the first region and the electron beam 8 that passes through the second region on the specimen plane. The two regions on the specimen plane are irradiated with the two electron beams, respectively. In this embodiment, the action of the second irradiation lens 4 makes it possible to irradiate the specimen with parallel electron beams.

Referring to the structure of the electron beam device shown in FIG. 8, establishment of the relationship that satisfies the formula (3) or (4) may solve the problem that the shadow of the first electron biprism hides the coherence region of the electron beam on the specimen plane. Furthermore, the relationship that satisfies the formula (5) may solve the problem of losing the function of adjusting the distance for irradiation on the specimen plane with electron beams split by the first electron biprism.

Fourth Embodiment

Figure 11:
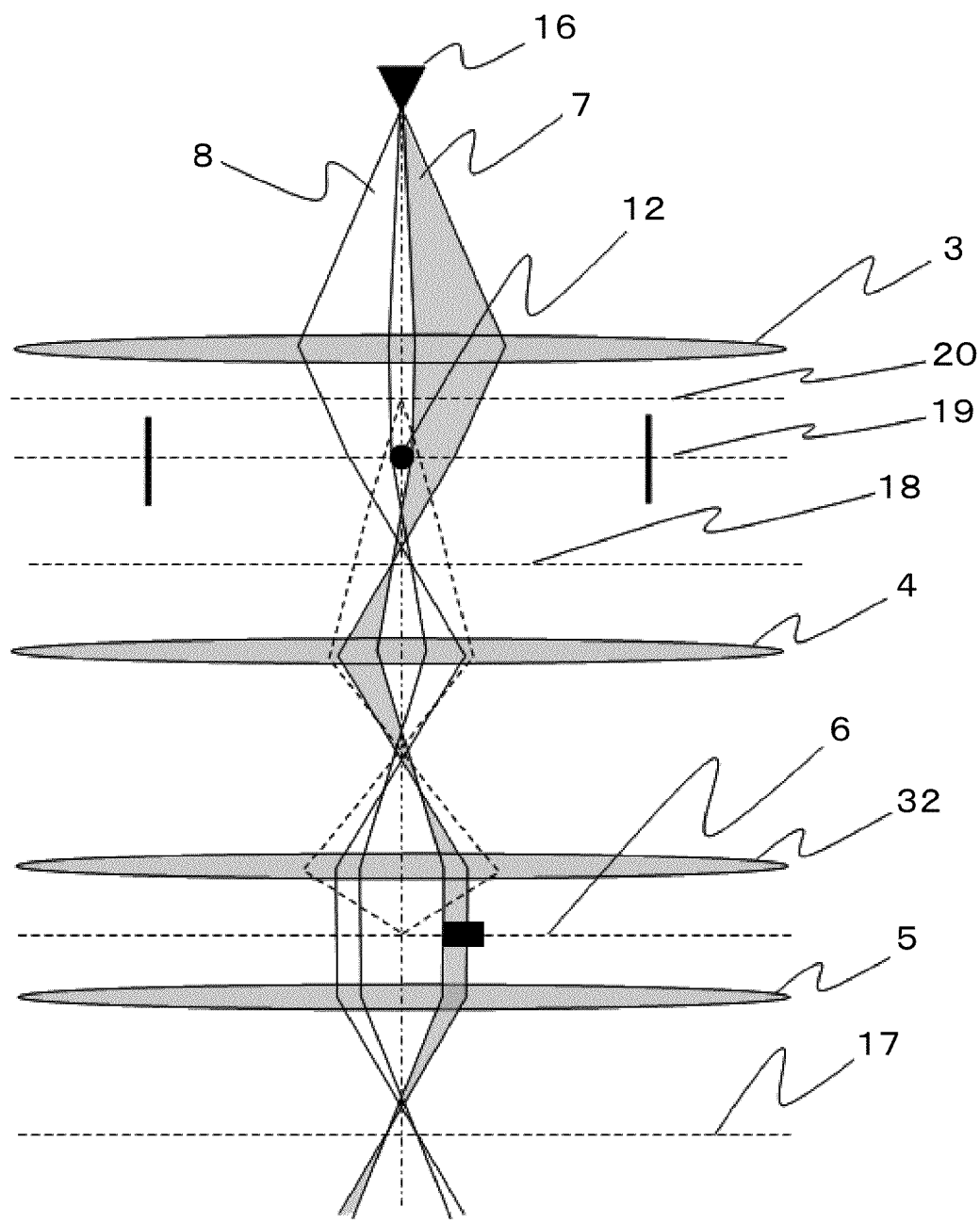
FIG. 11 is a schematic view showing an upper optical system of the fourth embodiment.

FIG. 10 is a schematic view showing an electron beam device according to a fourth embodiment. FIG. 11 shows an upper optical system of the electron beam device. Likewise the third embodiment, as the overall structure of the electron beam device is similar to that of the first embodiment, explanation of the same parts as those of the first embodiment will be omitted. The upper optical system with different device structure will only be described. According to this embodiment, the first electron biprism is provided inside the electron lens of the irradiating system, that is, provided between the first and the second irradiation electron lenses in the same manner as the third embodiment. The difference from the third embodiment is that action of the third irradiation electron lens 32 provided downstream of the second irradiation electron lens 4 irradiates the specimen with parallel electron beams.

Referring to FIG. 11, the first irradiation electron lens 3, the first electron biprism 12, the second irradiation electron lens 4, the third irradiation electron lens 32 and the specimen 6 are provided in this order in the direction downstream of the electron beam flow from the first electron source 16. The first electron biprism 12 provided between the first irradiation electron lens 3 and the second irradiation electron lens 4 deflects the electron beam with respect to the optical axis, which is directed toward the second irradiation electron lens 4.

Actions of the first irradiation electron lens 3, the second irradiation electron lens 4, and the third irradiation electron lens 32 control each current density and position of the electron beam 7 that transmits through the specimen 6 in the first region and the electron beam 8 that passes through the second region on the specimen plane. This makes it possible to irradiate the two regions on the specimen plane with those two electron beams, respectively.

Fifth Embodiment

Figure 12:
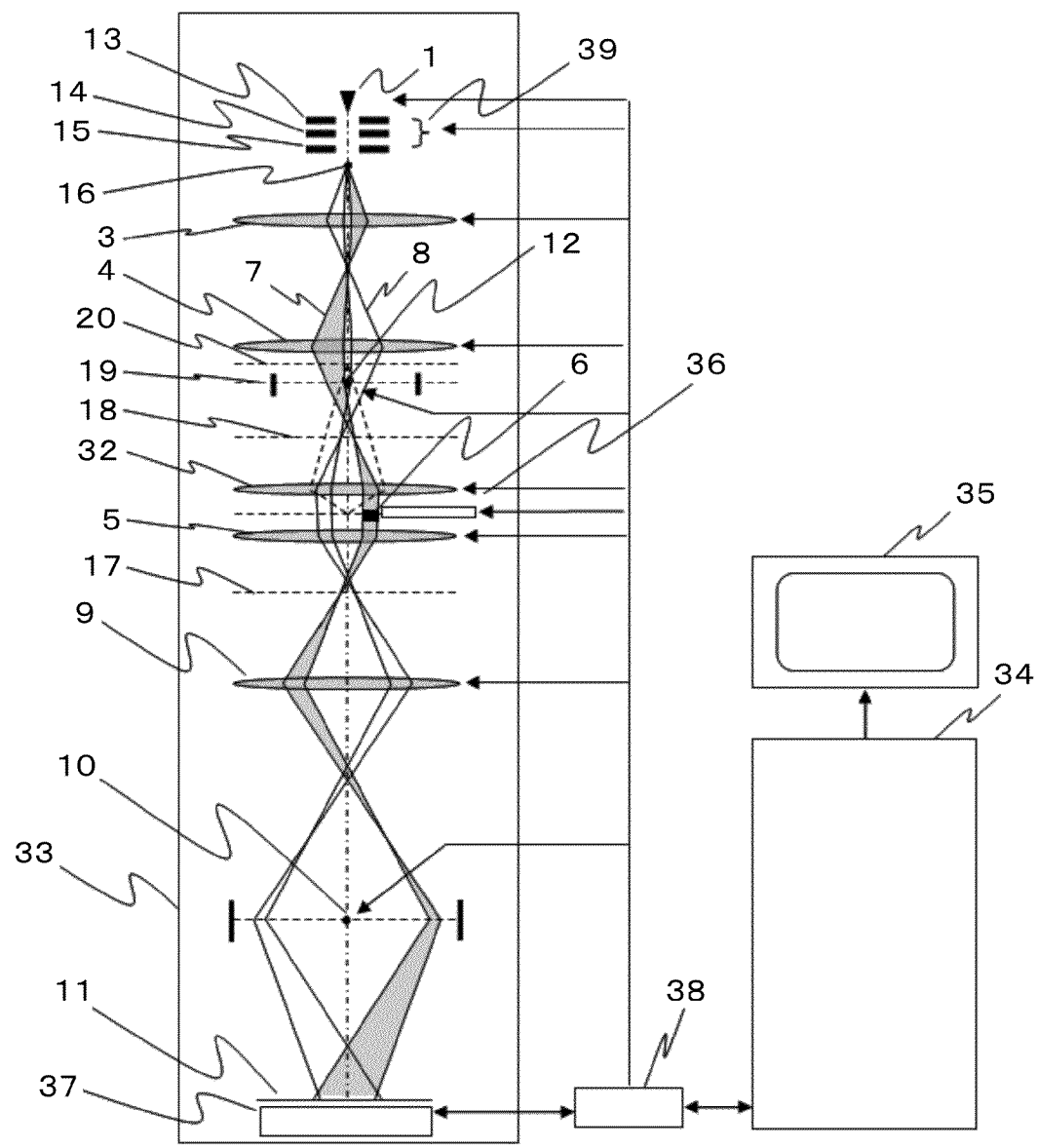
FIG. 12 is a schematic view showing an electron beam device according to a fifth embodiment, which includes a setup of a first irradiation electron lens, a second irradiation electron lens, a first electron biprism, a third irradiation electron lens, and a specimen in this order.
Figure 13:
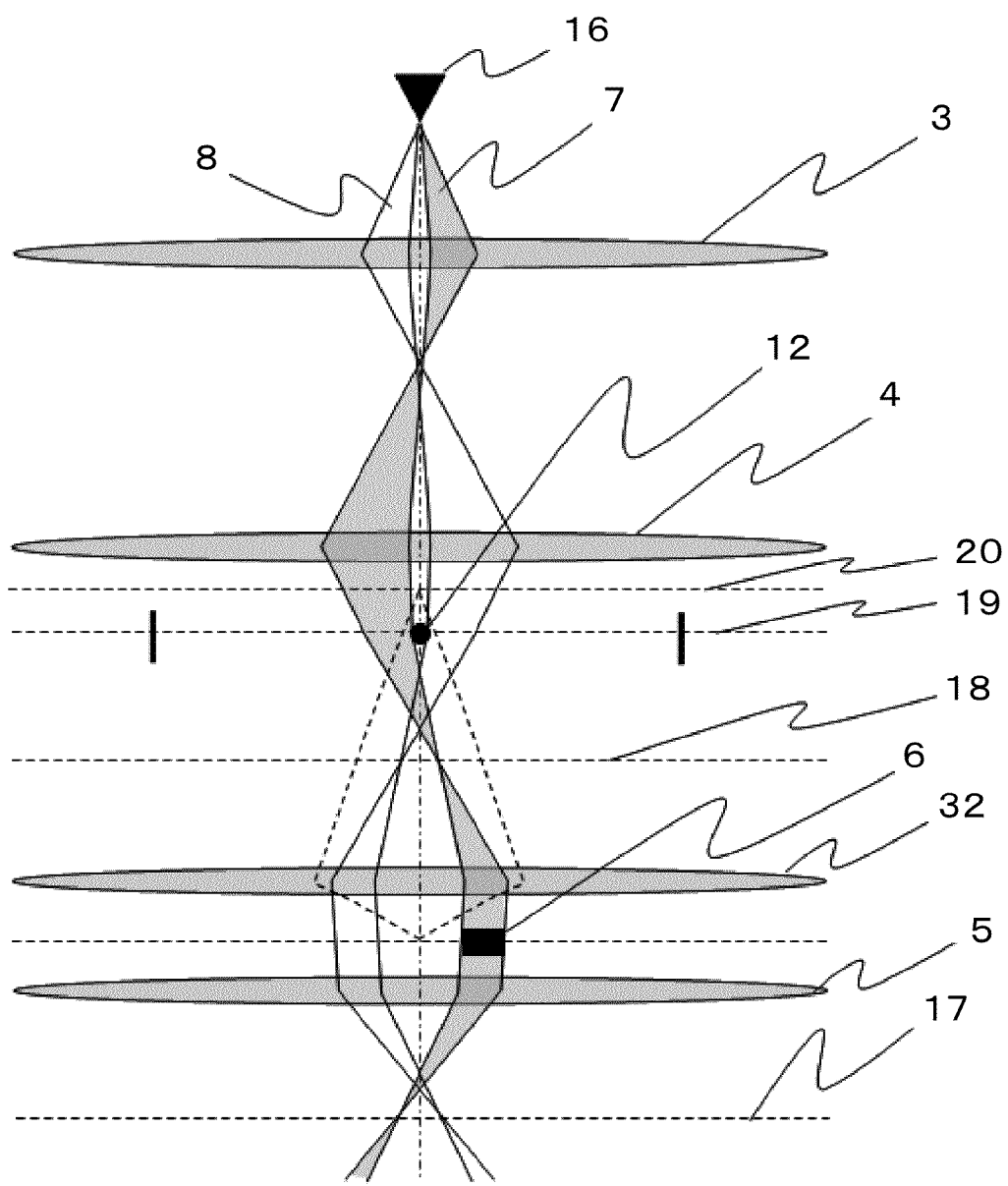
FIG. 13 is a schematic view showing an upper optical system of the fifth embodiment.

FIG. 12 is a schematic view showing an electron beam device according to a fifth embodiment. FIG. 13 shows an upper optical system of the electron beam device. As the device structure is similar to that of the first or the fourth embodiment, explanation of the same parts as those of the first or the fourth embodiment will be omitted. The upper optical system with different device structure will only be described. According to the embodiment, the first electron biprism is provided inside the electron lens of the irradiation system. The difference from the fourth embodiment is that the first electron biprism is provided between the second irradiation electron lens 4 and the third irradiation lens 32.

As FIG. 13 clearly shows, for the electron beam device according to the embodiment, the first irradiation electron lens 3, the second irradiation electron lens 4, the first electron biprism 12, the third irradiation electron lens 32, and the specimen 6 are provided in this order in the direction downstream of the electron beam flow from the first electron source 16. The first electron biprism 12 between the second irradiation electron lens 4 and the third irradiation electron lens 32 deflects the electron beam with respect to the optical axis, which is directed toward the third irradiation electron lens 32.

Actions of the first irradiation electron lens 3, the second irradiation electron lens 4, and the third irradiation electron lens 32 of the above-structured device control each current density and position of the electron beam 7 that transmits through the specimen 6 in the first region and the electron beam 8 that passes through the second region on the specimen plane. This makes it possible to irradiate the two regions on the specimen plane with the two electron beams, respectively.

Sixth Embodiment

Figure 14:
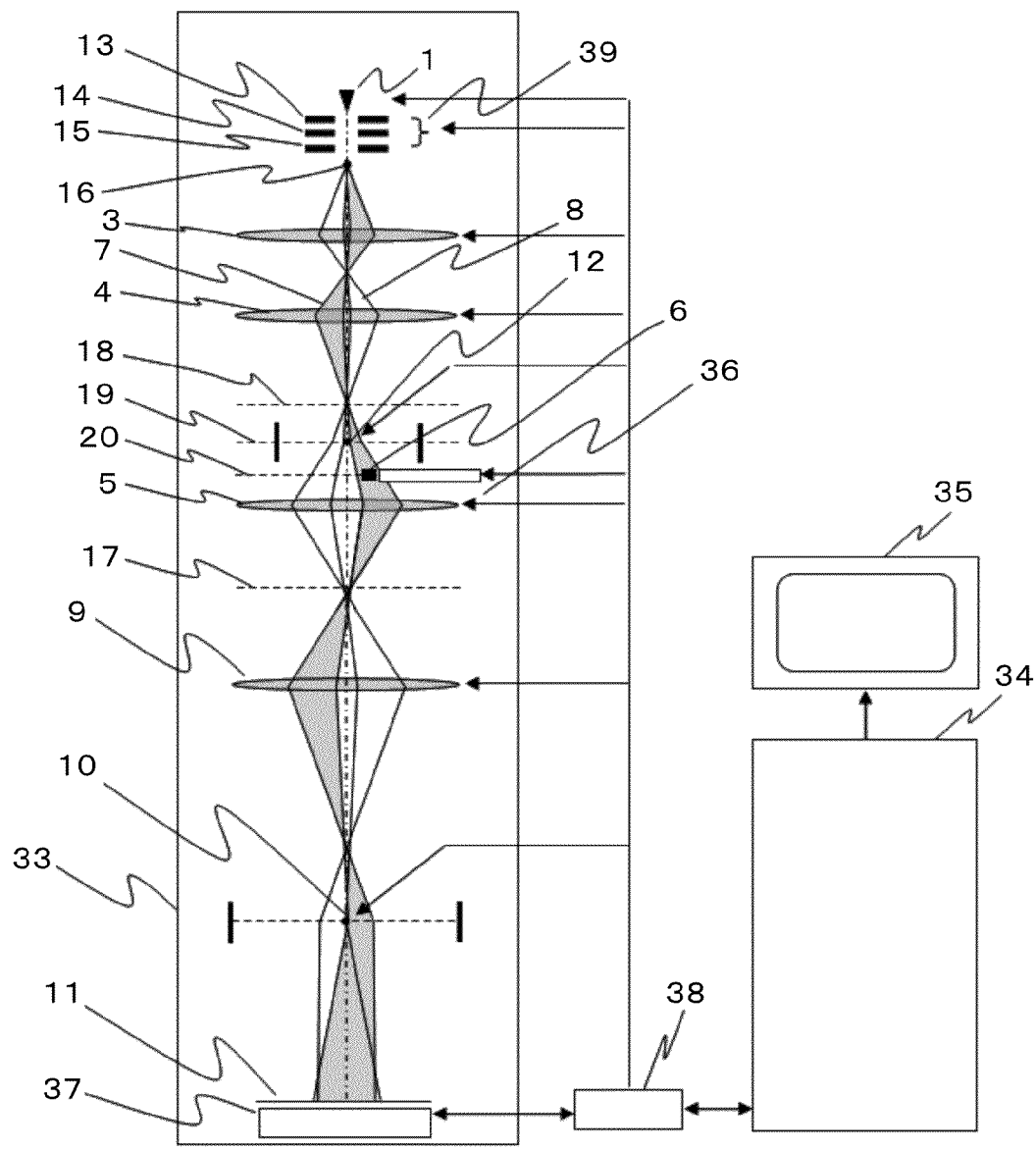
FIG. 14 is a schematic view showing an electron beam device according to a sixth embodiment, which includes a setup of a first irradiation electron lens, a second irradiation electron lens, a first electron biprism, and a specimen in this order.
Figure 15:
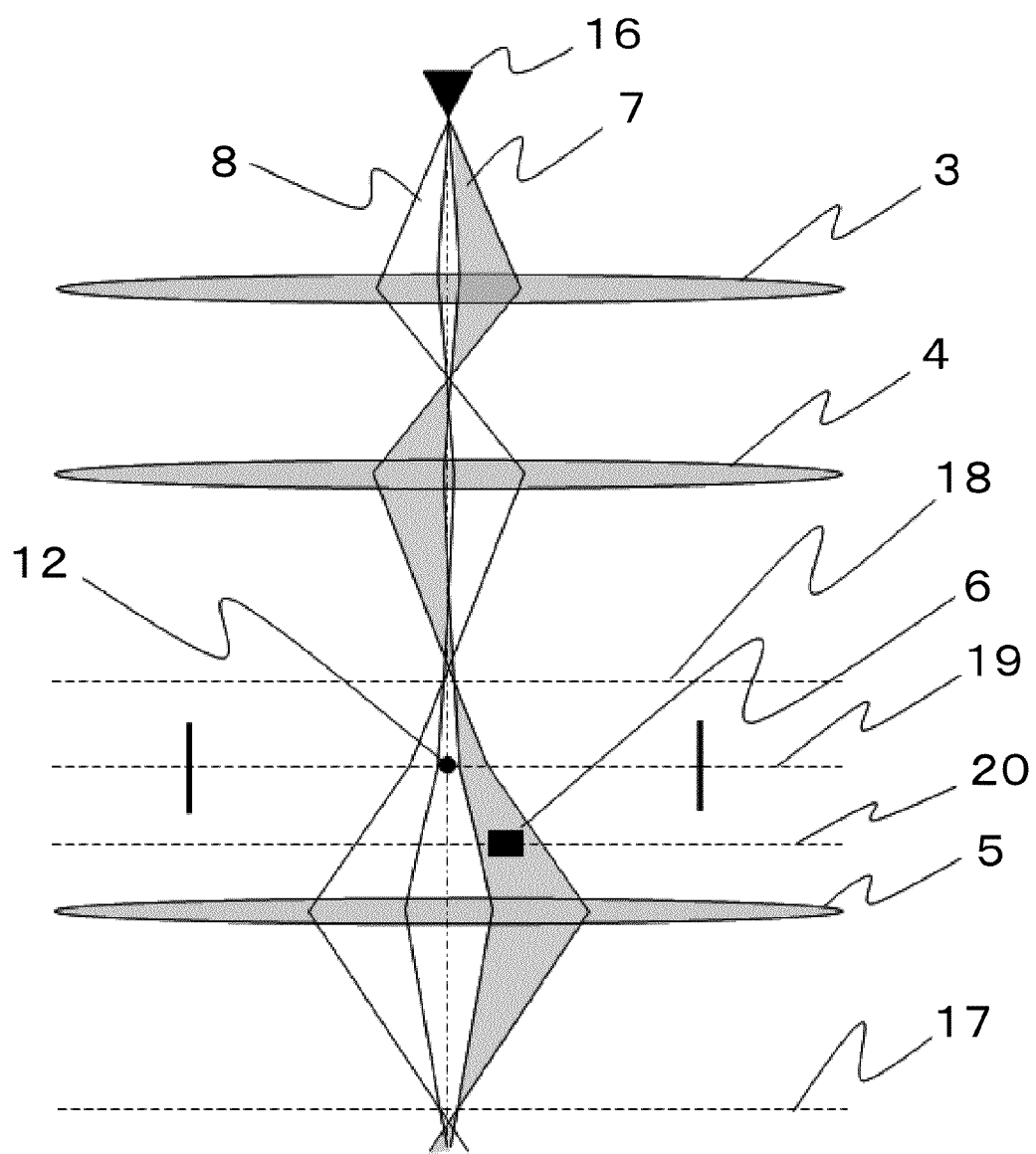
FIG. 15 is a schematic view showing an upper optical system of the sixth embodiment.

FIG. 14 is a schematic view showing an electron beam device according to a sixth embodiment. FIG. 15 shows an upper optical system of the electron beam device. As the overall structure of the electron beam device is similar to that of the first embodiment, explanation of the same parts as those of the first embodiment will be omitted. The upper optical system with the different device structure will only be described. The electron beam device according to this embodiment has the feature that the first electron biprism is provided downstream of the electron lens of the irradiation system and upstream of the specimen plane 20. In this way, the biprism provided downstream of the electron lens of the irradiation system does not change the relationship between the specimen and the biprism. The split width on the specimen plane with respect to the applied voltage becomes uniform, allowing the user to easily control the split width.

The aforementioned advantage may be easily obtained by installing the biprism in a specimen holder of the electron beam device as the base with no port for mounting the biprism in the irradiation system likewise the generally employed electron microscope.

Specifically, as the upper optical system shown in FIG. 15 clearly shows, the first irradiation electron lens 3, the second irradiation electron lens 4, the first electron biprism 12, and the specimen 6 are provided in this order in the direction downstream of the electron beam flow from the first electron source 16. The first electron biprism 12 between the second irradiation electron lens 4 and the specimen deflects the electron beam with respect to the optical axis, and controls each position of the electron beam 7 that transmits through the specimen 6 in the first region and the electron beam 8 that passes through the second region on the specimen plane, which is directed toward the specimen. Actions of the first irradiation electron lens 3 and the second irradiation electron lens 4 control each current density of the electron beam 7 that transmits through the specimen 6 in the first region and the electron beam 8 that passes through the second region on the specimen plane. The two regions on the specimen plane 20 are irradiated with two electron beams, respectively.

The structure according to this embodiment has the biprism disposed downstream of the electron lens of the irradiation system, and the relationship between the specimen and the biprism does not change. This allows the split width on the specimen plane to be uniform with respect to the applied voltage. It is convenient for the user to control the split width. The desired advantage may be easily obtained by installing the biprism in the specimen holder of the electron beam device as the base with no port for mounting the biprism in the irradiation system.

Establishment of the relationship that satisfies the formula (3) or (4) by the structure of the electron beam device as shown in FIG. 14 may solve the problem that the shadow of the first electron biprism hides the coherence region of the electron beam on the specimen plane. Furthermore, establishment of the relationship that satisfies the formula (5) may solve the problem of losing the function of adjusting the distance for irradiation on the specimen plane with electron beams split by the first electron biprism.

Seventh Embodiment

Figure 16:
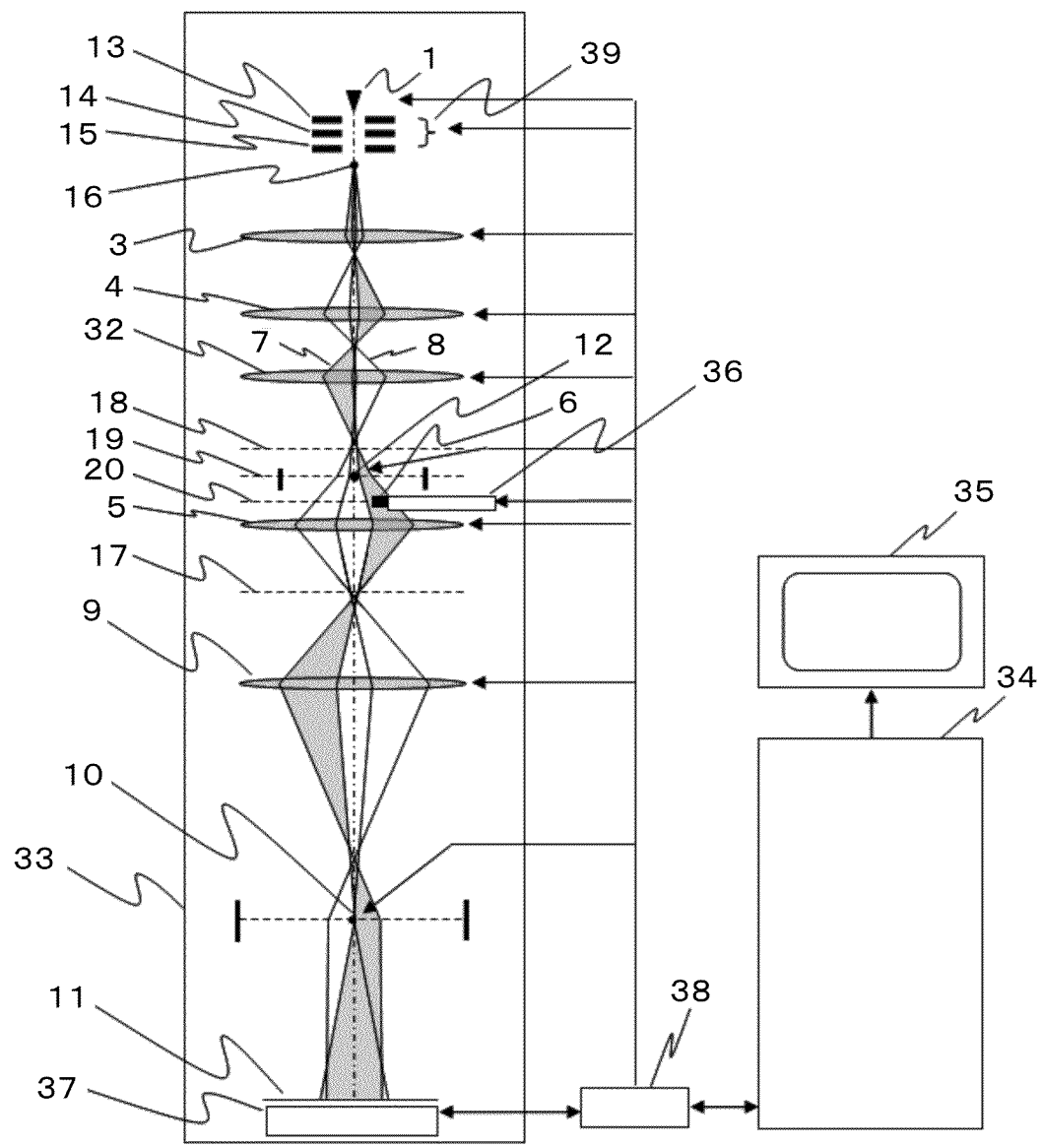
FIG. 16 is a schematic view showing an electron beam device according to a seventh embodiment, which includes a setup of a first irradiation electron lens, a second irradiation electron lens, a third irradiation electron lens, a first electron biprism, and a specimen in this order.
Figure 17:
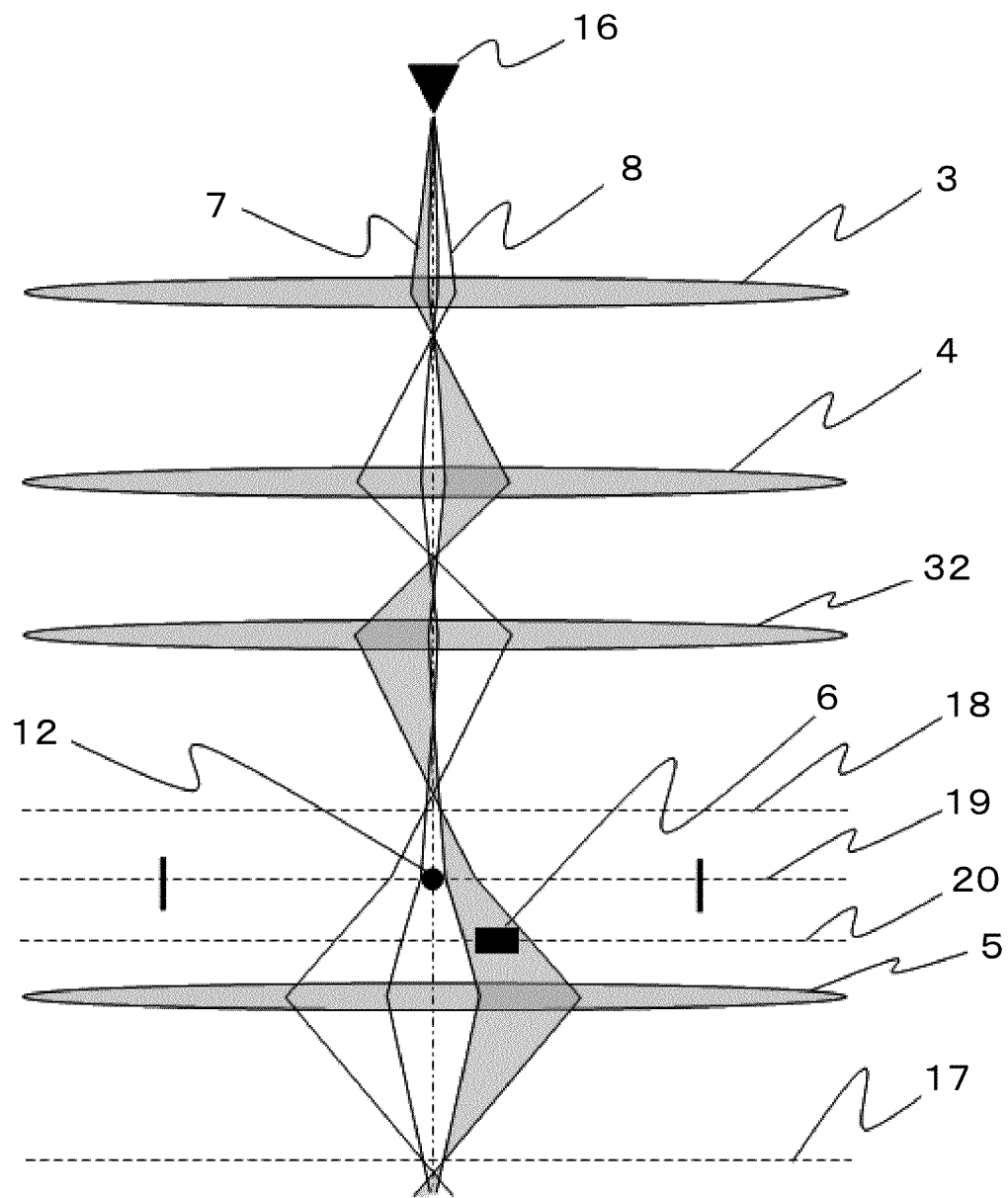
FIG. 17 is a schematic view showing an upper optical system of the seventh embodiment.

FIG. 16 is a schematic view showing an electron beam device according to a seventh embodiment. FIG. 17 shows an upper optical system of the electron beam device. The overall structure of the electron beam device according to this embodiment is similar to that of the first embodiment or the sixth embodiment. Therefore, explanation of the same parts as those of the first or the sixth embodiment will be omitted. The upper optical system with different device structure will only be described. The structure of the electron beam device according to this embodiment has the feature that the first electron biprism is provided downstream of the electron lens of the irradiation system, and upstream of the specimen plane 20 likewise the sixth embodiment. The difference from the sixth embodiment is that the third irradiation electron lens 32 is provided downstream of the second irradiation electron lens 4 and upstream of the first electron biprism 12.

More specifically, the first irradiation electron lens 3, the second irradiation electron lens 4, the third irradiation electron lens 32, the first electron biprism 12, and the specimen 6 are provided in this order in the direction downstream of the electron beam flow from the first electron source 16. The first electron biprism 12 between the third irradiation electron lens 32 and the specimen 6 deflects the electron beam with respect to the optical axis, and controls each position of the electron beam 7 that transmits through the specimen 6 in the first region and the electron beam 8 that passes through the second region on the specimen plane, which is directed to the specimen.

Actions of the first irradiation electron lens 3, the second irradiation electron lens 4, and the third irradiation electron lens 32 control each current density of the electron beam 7 that transmits through the specimen 6 in the first region and the electron beam 8 that passes through the second region on the specimen plane. This makes it possible to irradiate the two regions on the specimen plane with two electron beams, respectively. Likewise the sixth embodiment, as the biprism is provided downstream of the electron lens of the irradiation system, the relationship between the specimen and the biprism does not change. This may make the split width on the specimen plane uniform with respect to the applied voltage, allowing the user to easily control the split width. The aforementioned advantage may be easily obtained by installing the biprism in the specimen holder of the electron beam device as the base with no port for mounting the biprism in the irradiation system.

Eighth Embodiment

Figure 18:
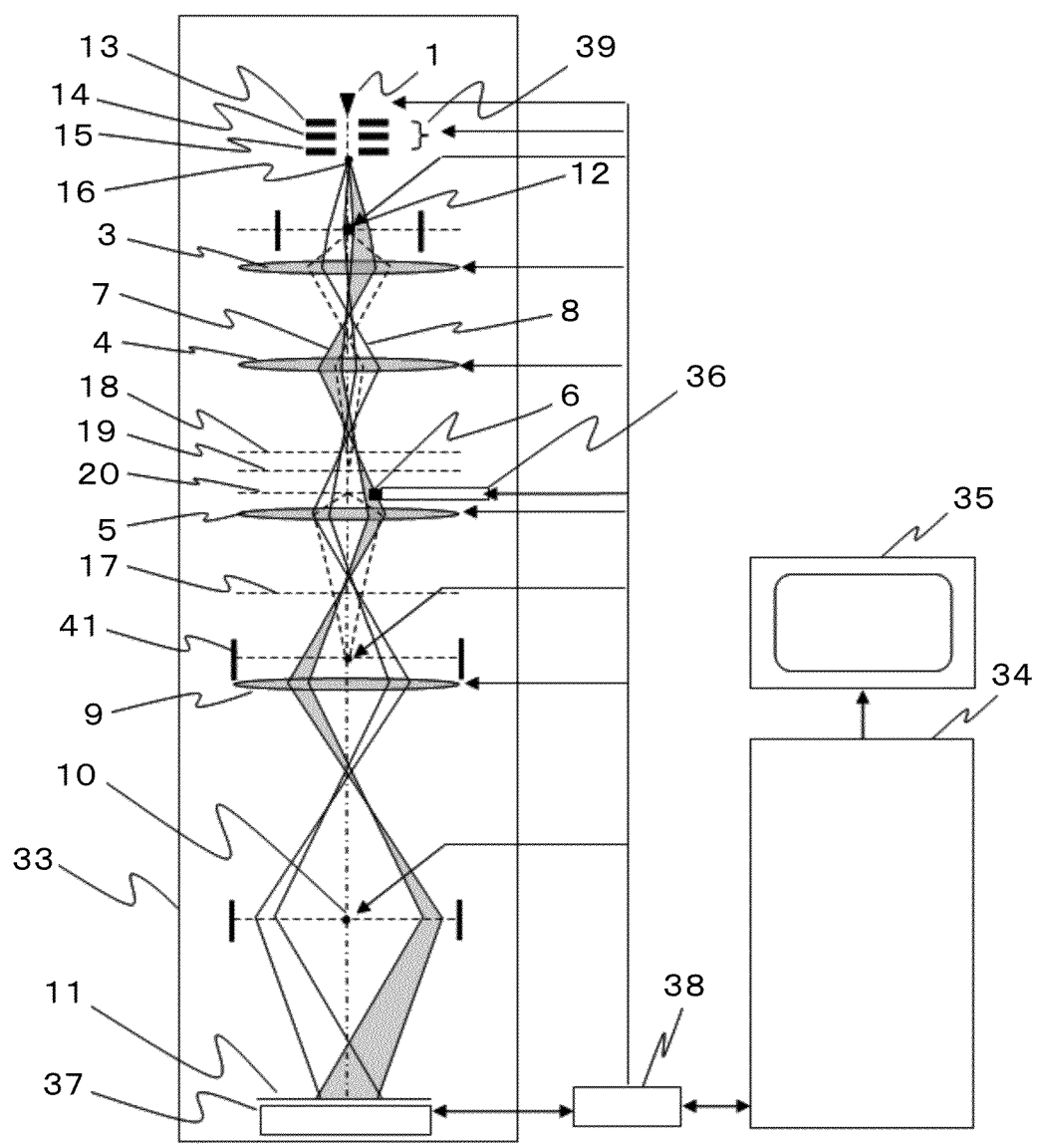
FIG. 18 is a schematic view showing an electron device according to an eighth embodiment, which is formed by combining a double biprism of the image forming system with the first embodiment.

FIG. 18 is a schematic view showing an electron beam device according to an eighth embodiment. The overall structure of the electron beam device of the embodiment is similar to that of the first embodiment. Explanation of the same parts as those of the first embodiment, thus will be omitted. Likewise the first embodiment, the first electron biprism is provided downstream of the first electron beam 16 and upstream of the electron lens of irradiation system. The difference from the first embodiment is the use of the third electron biprism.

Referring to the electron beam device shown in FIG. 18, the first electron biprism 12 between the acceleration tube 39 and the first irradiation electron lens 3 in the direction downstream of the electron beam flow from the first electron source 16 deflects the electron beam with respect to the optical axis, which is directed to the first irradiation electron lens 3. Actions of the first irradiation electron lens 3 and the second irradiation electron lens 4 control each current density and position of the electron beam 7 that transmits through the specimen 6 in the first region and the electron beam 8 that passes through the second region on the specimen plane. The two regions on the specimen plane are irradiated with two electron beams, respectively.

Furthermore, the electron beam device according to this embodiment has the electrode filament of the third electron biprism 41 between the objective lens 5 and the magnifying lens 9 on the image plane where the specimen image is formed by the action of the objective lens 5. The second electron biprism 10 is provided at the shadow position of the third electron biprism 41 between the image planes formed by the action of the magnifying lens 9.

The system according to the embodiment is configured to control the voltage applied to the second electron biprism 10 and the third electron biprism 41, which ensures arbitrary control of spacing of the electron beam interference fringes, and the width of the interference region.

Establishment of the relationship that satisfies the formula (3) or (4) by the structure of the electron beam device shown in FIG. 18 may solve the problem that the shadow of the first electron biprism hides the coherence interference region of the electron beam on the specimen plane. Furthermore, establishment of the relationship that satisfies the formula (5) may solve the problem of losing the function of adjusting the distance for irradiation on the specimen surface with the electron beams split by the first electron biprism.

The advantage of the present invention will be described by comparing the measurement results of the electron beam device according to the eighth embodiment with those of related art in reference to FIGS. 19, 20 and 21. The device structure according to the eighth embodiment was used to indicate the state where the first electron biprism 3 is not provided by comparing the related art where the specimen is irradiated with the electron beam without being split with the method according to the invention where the specimen is irradiated with the electron beams split by the first electron biprism 3.

Figure 19:
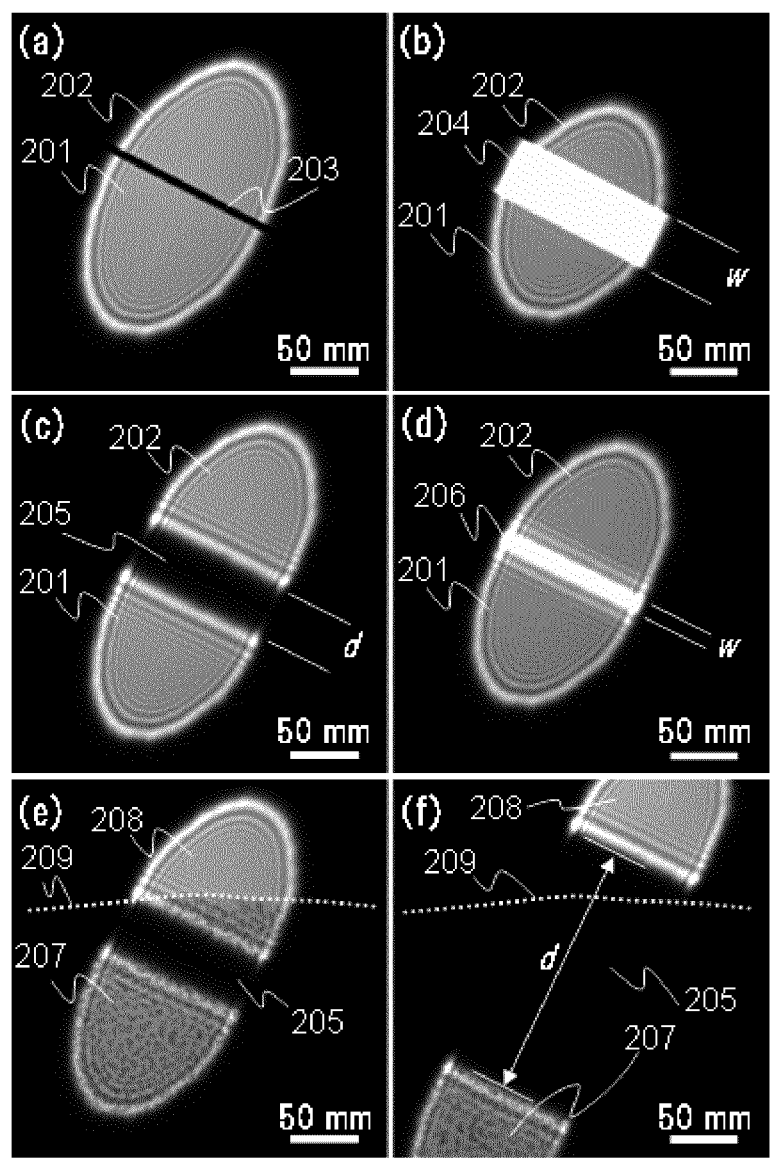
FIG. 19 is an explanatory view each showing an electron microscope image indicating the state where the electron beam is split by the electron beam device according to the eighth embodiment.

FIG. 19 represents images (a)-(f) of the electron microscope, each showing the state where the electron beam is split. (a) of FIG. 19 shows the image of the electron beam for radiating the specimen, which is obtained by irradiating the specimen plane with the elliptic beam disclosed in Non-Patent Literature 1, and providing a double electron biprism disclosed in Japanese Patent Application Laid-Open Publication Nos. 2006-216345 and 2006-313069 without applying the voltage to the third electron biprism 41 of the image forming system where the first electron biprism 3 is not provided.

An electron beam 201 that transmits through the specimen in the first region and an electron beam 202 that passes through the second region are positioned having a shadow 203 of the third electron biprism interposed therebetween. (b) of FIG. 19 shows the image obtained by applying the voltage of 60V to the second electron biprism 10, and superposing the electron beam 201 that transmits through the specimen in the first region on the electron beam 202 that passes through the second region. The interference region width W of the resultant interference region 204 converted in terms of the specimen plane measured 41 nm. The distance D between two interfering waves on the specimen plane is 50 nm obtained by adding the width of 9 nm of the shadow 203 of the third biprism 203 in terms of the specimen plane to the interference region width W converted in terms of the specimen plane.

Meanwhile, if the split electron beam is radiated using the method according to the present invention, and the voltage of 0.6 V is applied to the first electron biprism 12, the width d of a shadow 205 between the electron beam 201 that transmits through the first region (specimen) and the electron beam 202 that passes through the second region on the specimen plane is 38 nm as indicated by (c) of FIG. 19. In order to obtain the interference region width W of 12 nm, the voltage of 60 V is applied to the third electron biprism 41 as (d) of FIG. 19 shows. The distance D on the specimen plane between two interfering waves is 50 nm obtained by adding the width of the shadow 205 of 38 nm between the split electron beams converted in terms of the specimen plane to the interference region width W of 12 nm converted in terms of the specimen plane.

The platinum evaporation particle on the carbon film is set as the thin film specimen, and the voltage of 0.6 V is applied to the first electron biprism 12. The electron beam is split into an electron beam 207 that transmits through the platinum evaporation particle on the carbon film in the first region and the electron beam 208 that passes through the second region as shown by (e) of FIG. 19. A broken line 209 in the drawing denotes the edge of the thin film specimen.

As a result of applying the voltage of 4.0 V to the first electron biprism 12, the width d of the shadow 205 was 190 nm between the electron beam 207 transmitting through the platinum evaporation particle on the carbon film in the first region and the electron beam 208 passing through the second region, which were split on the specimen plane as shown in (f) of FIG. 19.

This result indicates that the electron beam device according to the present invention allows the voltage applied to the first electron biprism 12 to freely control the distance between the electron beam 201 that transmits through the specimen in the first region and the electron beam 202 that passes through the second region on the specimen plane.

Figure 20:
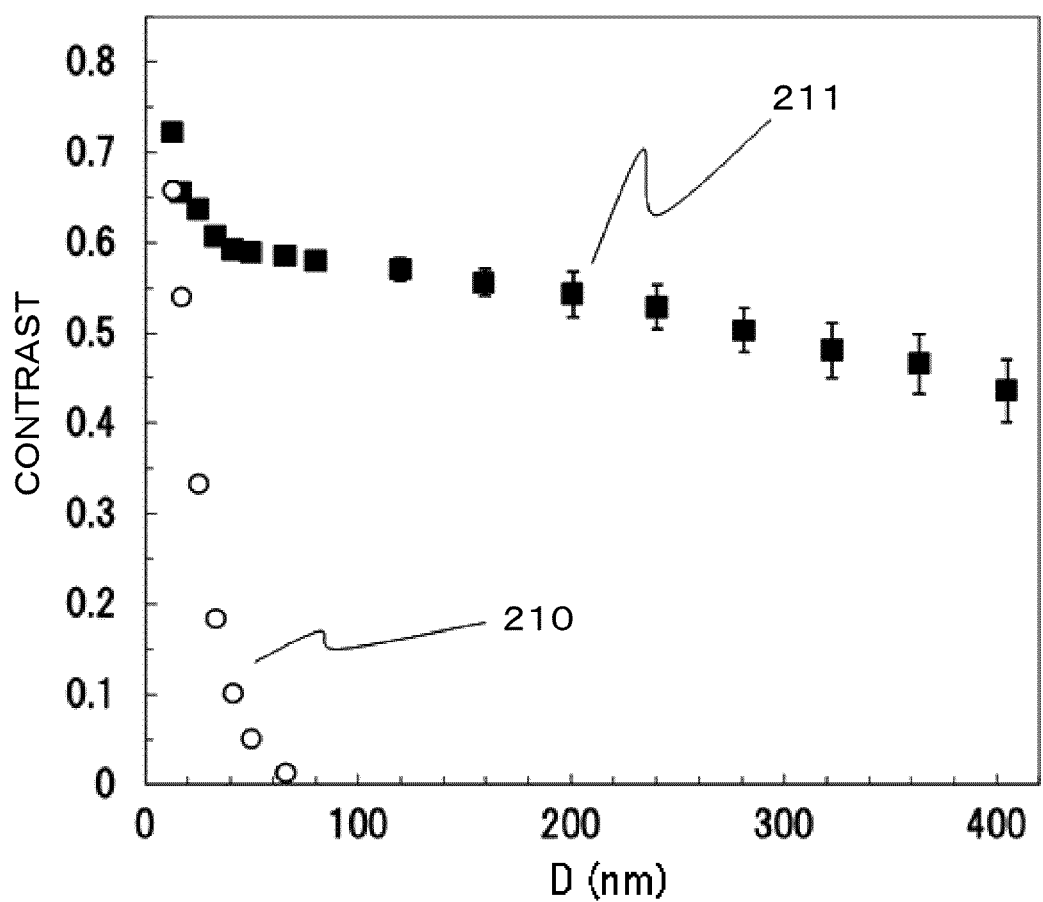
FIG. 20 is an explanatory view showing a relationship between contrast of interference fringe and a distance between two interfering waves on the specimen plane, which are derived from the electron beam device according to the eighth embodiment.

FIG. 20 is a graph showing each change in the interference fringe contrast with respect to the distance D between the two interfering waves on the specimen plane, which is derived from the method that irradiates the specimen with the electron beam which is not split, and the method according to the present invention that irradiates the specimen with the split electron beams. The x-axis denotes the distance D, and the y-axis denotes the contrast of the interference fringe. The distance D between the two interfering waves on the specimen plane is controlled by the voltage applied to the third electron biprism 41. The voltage applied to the second electron biprism is controlled so that the spacing of the interfering fringes becomes 0.29 nm.

With the method of irradiation without splitting the electron beam, the distance D between the two interfering waves on the specimen plane is associated with the interference region width W. Therefore, they cannot be controlled independently. Meanwhile, the method of irradiating the specimen with the split electron beams according to the present invention is capable of controlling the distance D between the two interfering waves on the specimen plane and the interference region width W independently. Therefore, when obtaining a contrast 211 of the interference fringe by splitting the electron beam shown in FIG. 20, which is radiated to the specimen, the voltage applied to the first electron biprism 12 and the voltage applied to the third electron biprism 41 are controlled so that the interference region width W becomes 12 nm. As FIG. 20 shows, a contrast 210 of the interference fringe obtained by irradiating the specimen with the electron beam that is not split hardly attains the contrast of the interference fringe when the distance D between the two interfering waves on the specimen plane becomes 60 nm or larger.

Meanwhile, the contrast 211 of the interference fringe obtained by irradiating the specimen with split electron beams retains 0.4 (40%) or higher even if the distance D between the two interfering waves on the specimen plane is 400 nm. The result indicates that the method according to the present invention allows the first electron biprism 12 to split the electron beam so as to irradiate the points on the specimen, which are separated from each other while keeping the interference of the electron wave that reaches the specimen plane.

Figure 21:
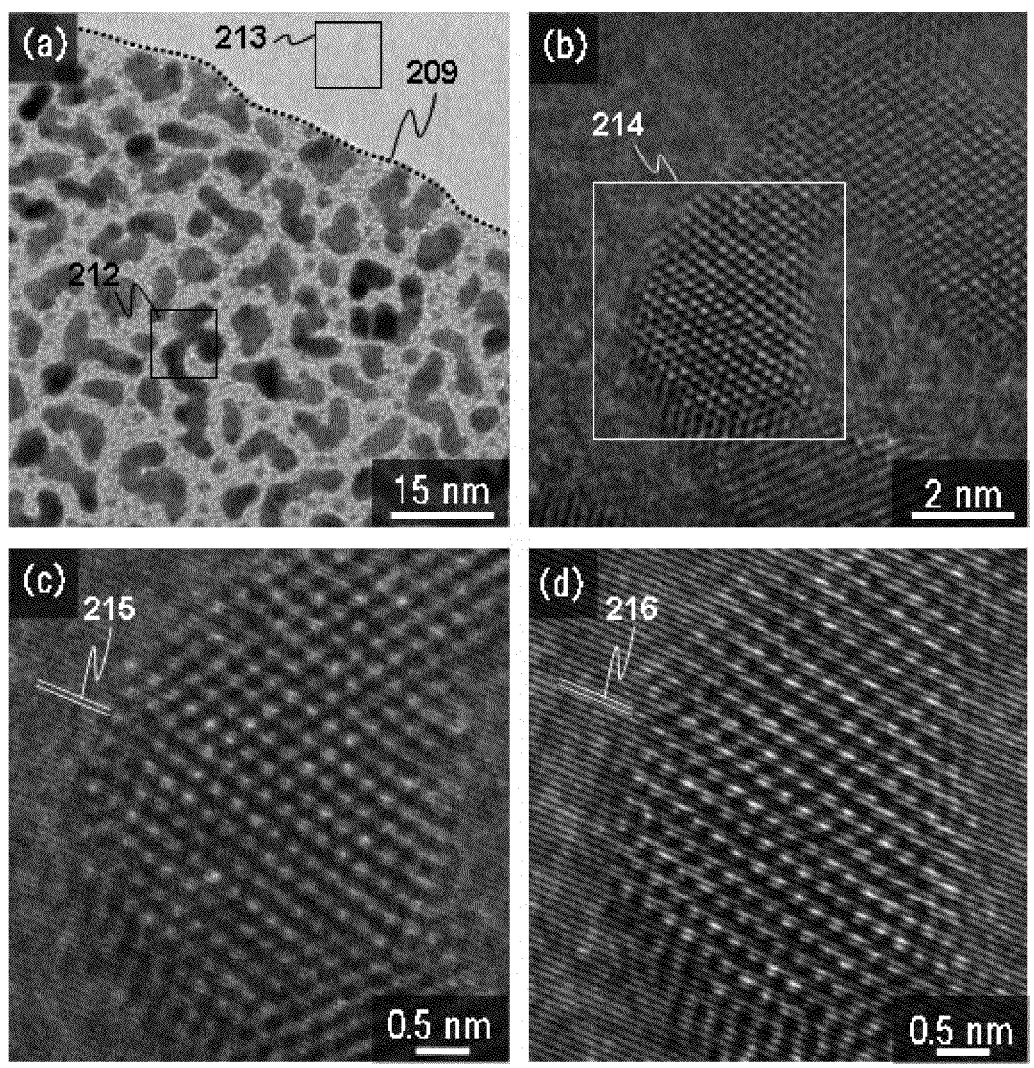
FIG. 21 is an explanatory views each showing an image of electron beam interference at a place separated from an edge of the thin film specimen, which are derived from the electron beam device according to the eighth embodiment.

FIG. 21 shows observation results of the high resolution hologram (interference image) at the position inside the thin film separated from the thin film specimen edge 209. (a) of FIG. 21 shows the positional relationship between the first region (object wave) 212 inside the thin film specimen and the second region (reference wave) 213 superposed on the first region when obtaining the interference fringes. The distance D between the two interfering waves on the specimen plane was 50 nm. (b) of FIG. 21 shows the obtained hologram (interference image). As conditions for obtaining the hologram, the spacing of the interference fringes was set to 0.07 nm, the exposure time was set to 1.5 s, and magnification on CCD was set to 6000000×.

Assuming that the distance D between the two interfering waves on the specimen plane is set to 50 nm, the hologram (interference image) obtained by irradiating the specimen with the electron beam without being split is shown in (c) of FIG. 21, and the hologram (interference image) obtained by irradiating the specimen with the split electron beams is shown in FIG. (d) of 21. The contrast of an interference fringe 215 obtained by irradiating the specimen with the electron beam without being split was measured 6%. Meanwhile, the contrast of an interference fringe 216 obtained by irradiating the specimen with the split electron beams was measured 34%. Upon observation, the distance from the first electron biprism to the plane of the first line of the Fresnel fringe is controlled to be smaller than the coherence distance of the irradiation electron beam on the specimen plane.

This result indicates that irradiation of the specimen with split electron beams using the electron beam device according to the present invention ensures the hologram (interference image) with higher contrast in the region separated from the thin film specimen edge compared with the one obtained by the generally employed method of irradiating the specimen with the electron beam without being split.

According to the invention as described in detail, the first electron biprism provided between the acceleration tube and the irradiation system, irradiation systems, or the irradiation system and the specimen plane splits the electron beam, and increases the in-plane distance between the electron beam that transmits through the specimen in the first region and the electron beam that passes through the second region on the specimen plane while maintaining the interference. The action of the lens of the irradiation system allows control of each current density of the first electron beam that transmits through the specimen in the first region and the electron beam that passes through the second region on the specimen plane. The second electron biprism of the image forming system superposes the first electron beam and the second electron beam on the observation plane, thus making it possible to provide the hologram with high contrast.

The present invention is capable of providing the high contrast hologram of the region at the inner side of the thin film specimen from the edge at high current density with high magnification, which cannot be observed with the generally employed electron holography. This makes it possible to reduce noise of reconstructed phase image upon phase reconstruction of the hologram, and to perform the phase analysis with high accuracy.

Upon provision of the hologram, charging resulting from irradiation of the specimen with the electron beam influences the electron beam that passes through the second region to distort the interference fringe, and the leakage magnetic field owing to the specimen with large leakage magnetic field influences the electron beam that passes through the second region to distort the interference fringe, resulting in deteriorated accuracy of the phase analysis. The present invention makes it possible to adjust and increase the in-plane distance between the electron beam that transmits through the specimen in the first region and the electron beam that passes through the second region on the specimen plane. It is capable of providing the phase reconstructed image with higher accuracy than the one obtained by+ the generally employed holography.

The electron beam device of the present invention allows the nano structure analysis, observation of the magnetic field and electric field of the nano scale structure, and distribution of the electron spin in the material arbitrarily. This is expected to be utilized for the study and development of the base material, semiconductor device, the spintronics material or the spintronics device.

The invention claimed is:
1. An electron beam device comprising:
an electron source;
an acceleration tube that brings an electron emitted from the electron source into an electron beam at a predetermined velocity;
an irradiation lens system that irradiates a specimen with the electron beam;
a specimen holder that holds the specimen;
an objective lens system that includes at least one electron lens for forming an image of the specimen;
an image forming lens system that forms the image of the specimen, which has been formed by the objective lens system;
an observation plane for observation of the specimen image formed by the image forming lens system;
an observation recording system for observing or recording the specimen image formed on the observation plane;
a first electron biprism provided between the acceleration tube and the irradiation lens system for splitting the electron beam into a first electron beam and a second electron beam; and
at least one electron biprism provided in the image forming lens system for superposing the first electron beam and the second electron beam on the observation plane, wherein:
an optical action of the irradiation lens system controls each current density of the first electron beam and the second electron beam on an objective plane of the objective lens system where the specimen exists, and a distance on electron optics between the first electron biprism and the objective plane of the objective lens system where the specimen exists;
a first region and a second region differently positioned on the objective plane of the objective lens system are irradiated with the first electron beam and the second electron beam, respectively; and
a superposed region of the first electron beam and the second electron beam on the observation plane is observed or recorded by the observation recording system.

2. The electron beam device according to claim 1, wherein each position of the first region and the second region is controlled by a deflecting action of the first electron biprism on the electron beam, or by an optical action of the irradiation lens system on the first electron beam and the second electron beam.

3. The electron beam device according to claim 1, wherein:
an area inside or outside the specimen is a region on the objective plane of the objective lens system, which is irradiated with the first electron beam; and
an area that is not irradiated with the first electron beam is a region on the objective plane of the objective lens system, which is irradiated with a second electron beam.

4. The electron beam device according to claim 1, wherein an electron biprism provided in the image forming lens system is placed in a shadow space formed by the first electron biprism.

5. The electron beam device according to claim 1, wherein the first electron biprism and the electron biprism provided in the image forming lens system deflect the first electron beam and the second electron beam in the same plane on electron optics including the optical axis.

6. The electron beam device according to claim 1, wherein actions of the first electron biprism and the electron biprism provided in the image forming lens system for deflecting the first electron beam and the second electron beam form an electron interference fringe in the superposed region on the observation plane.

7. The electron beam device according to claim 1, wherein:
the electron biprism provided in the image forming lens system includes a second electron biprism and a third electron biprism; and
a plurality of electron lenses of the objective lens system or the image forming lens system, the second electron biprism, and the third electron biprism form a double electron biprism interference optical system.

8. An electron beam device provided with an electron biprism including a pair of parallel plate ground electrodes having an optical axis interposed therebetween, and an electrode filament provided in a center part of the parallel flat electrodes while perpendicularly intersecting the optical axis, comprising:
an electron source;
an acceleration tube that brings an electron emitted from the electron source into an electron beam at a predetermined velocity;
an irradiation lens system that irradiates a specimen with the electron beam;
a specimen holder that holds the specimen;
an objective lens system that includes at least one electron lens for forming an image of the specimen;
an image forming lens system that forms the image of the specimen, which has been formed by the objective lens system;
an observation plane for observation of the specimen image formed by the image forming lens system;
an observation recording system for observing or recording the specimen image formed on the observation plane;
a first electron biprism provided in the irradiation lens system for splitting the electron beam into a first electron beam and a second electron beam; and
at least one electron biprism provided in the image forming lens system for superposing the first electron beam and the second electron beam on the observation plane, wherein:
an optical action of the irradiation lens system controls each current density of the first electron beam and the second electron beam on the objective plane of the objective lens system where the specimen exists, and a distance on electron optics between the first electron biprism and the objective plane of the objective lens system where the specimen exists; and
the optical action of the irradiation lens system satisfies a formula (3) or (4)

[Formula 6]

$$\beta 1 < \lambda / 2 d 1 \quad (3)$$

[Formula 7]

$$L_{c1} > d1 \quad (4)$$

where $\lambda$ denotes a wavelength of the electron beam, $L_{c1}$ denotes a coherence distance of the electron beam on a plane of the electrode filament of the first electron biprism on the electron optics, $\beta 1$ denotes an opening angle of the electron beam emitted from the electron source on the electron optics with respect to the first electrode filament plane on the electron optics, and d1 denotes a diameter of the electrode filament of the first electron biprism on the electron optics.

9. The electron beam device according to claim 8, wherein a formula (5) is satisfied:

[Formula 8]

$$0 \neq L2 \quad (5)$$

where L2 denotes a distance from the electrode filament of the first electron biprism on the electron optics to the objective plane of the objective lens system where the specimen exists.

10. The electron beam device according to claim 8, wherein:
the irradiation lens system includes two irradiation electron lenses; and
a first irradiation electron lens, the first electron biprism, and a second irradiation electron lens are provided in this order from an upstream side of an advancing direction of the electron beam.

11. The electron beam device according to claim 8, wherein:
the irradiation lens system includes three irradiation electron lenses; and
a first irradiation electron lens, the first electron biprism, a second irradiation electron lens, and a third irradiation electron lens are provided in this order from an upstream side of an advancing direction of the electron beam.

12. The electron beam device according to claim 8, wherein:
the irradiation lens system includes three irradiation electron lens; and
a first irradiation electron lens, a second irradiation electron lens, the first electron biprism, and a third irradiation electron lens are provided in this order from an upstream side of an advancing direction of the electron beam.

13. The electron beam device according to claim 8, wherein:
the irradiation lens system includes three irradiation electron lenses; and
a first irradiation electron lens, a second irradiation electron lens, a third irradiation electron lens, and the first electron biprism are provided in this order from an upstream side of an advancing direction of the electron beam.

14. The electron beam device according to claim 8, wherein each position of the first region and the second region is controlled by a deflecting action of the first electron biprism on the electron beam, or by an optical action of the irradiation lens system on the first electron beam and the second electron beam.

15. The electron beam device according to claim 8, wherein:
an area inside or outside the specimen is a region on the objective plane of the objective lens system, which is irradiated with the first electron beam; and
an area that is not irradiated with the first electron beam is a region on the objective plane of the objective lens system, which is irradiated with a second electron beam.

16. The electron beam device according to claim 8, wherein an electron biprism provided in the image forming lens system is placed in a shadow space formed by the first electron biprism.

17. The electron beam device according to claim 8, wherein the first electron biprism and the electron biprism provided in the image forming lens system deflect the first electron beam and the second electron beam in the same plane on electron optics including the optical axis.

18. The electron beam device according to claim 8, wherein actions of the first electron biprism and the electron biprism provided in the image forming lens system for deflecting the first electron beam and the second electron beam form an electron interference fringe in the superposed region formed on the observation plane with recordable magnification.

19. The electron beam device according to claim 8, wherein:
- the image forming lens system includes a second electron biprism and a third electron biprism; and
- a double electron biprism interference optical system includes a plurality of electron lenses of the objective lens system or the image forming lens system, the second electron biprism, and the third electron biprism.

20. An electron beam device comprising:
- an electron source;
- an acceleration tube that brings an electron emitted from the electron source into an electron beam at a predetermined velocity;
- an irradiation lens system that includes at least one electron lens for irradiating a specimen with the electron beam;
- a specimen holder that holds the specimen;
- an objective lens system that includes at least one electron lens for forming an image of the specimen;
- an image forming lens system that forms the image of the specimen, which has been formed by the objective lens system;
- an observation plane for observation of the specimen image formed by the image forming lens system;
- an observation recording system for observing or recording the specimen image formed on the observation plane;
- a first electron biprism provided between the irradiation lens system and the specimen for splitting the electron beam into a first electron beam that transmits through the specimen and a second electron beam that does not transmit through the specimen; and
- at least one electron biprism provided in the image forming lens system for superposing the first electron beam and the second electron beam on the observation plane, wherein:
- an optical action of the irradiation lens system controls each current density of the first electron beam and the second electron beam on the objective plane of the objective lens system where the specimen exists, and a distance on electron optics between the electron source when the image is formed by the irradiation lens system and the objective plane of the objective lens system where the specimen exists;
- a distance between the first electron biprism and the objective plane of the objective lens system where the specimen exists on electron optics is controlled so that the first electron beam and the second electron beam are radiated to a first region and a second region differently positioned on the objective plane of the objective lens system where the specimen exists; and
- the superposed region of the first electron beam and the second electron beam on the observation plane is observed or recorded by the observation recording system.

* * * * *